United States Patent
Machida

(10) Patent No.: US 11,098,957 B2
(45) Date of Patent: Aug. 24, 2021

(54) LOOP-TYPE HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 63 days.

(21) Appl. No.: 16/535,597

(22) Filed: Aug. 8, 2019

(65) Prior Publication Data

US 2020/0049417 A1 Feb. 13, 2020

(30) Foreign Application Priority Data

Aug. 13, 2018 (JP) .............................. JP2018-152494

(51) Int. Cl.
*F28D 15/00* (2006.01)
*F28D 15/02* (2006.01)
*F28D 15/04* (2006.01)

(52) U.S. Cl.
CPC ....... *F28D 15/0266* (2013.01); *F28D 15/046* (2013.01)

(58) Field of Classification Search
CPC ..................... F28D 15/0266; F28D 15/046
USPC .................................................... 165/104.26
See application file for complete search history.

(56) References Cited

U.S. PATENT DOCUMENTS 10,598,446 B2 * 3/2020 Saiwai ................ F28D 15/0266
2016/0259383 A1 9/2016 Shioga et al.
2017/0153072 A1 * 6/2017 Saiwai .................. F28D 15/046
2018/0058767 A1 3/2018 Machida et al.
2018/0142960 A1 5/2018 Kurashima et al.
2018/0164043 A1 6/2018 Kurashima et al.
2018/0177077 A1 6/2018 Shioga et al.
2019/0227607 A1 7/2019 Machida
2019/0277574 A1 9/2019 Kurashima et al.

FOREIGN PATENT DOCUMENTS

| CN | 108225072 A | 6/2018 |
| JP | 2015-183880 | 10/2015 |
| JP | 6146484 | 5/2017 |

OTHER PUBLICATIONS

European Search Report dated Jan. 20, 2020, 7 pages.

* cited by examiner

*Primary Examiner* — Davis D Hwu
(74) *Attorney, Agent, or Firm* — Rankin, Hill & Clark LLP

(57) ABSTRACT

A loop-type heat pipe includes an evaporator configured to vaporize an operating fluid, a condenser configured to liquefy the operating fluid, a liquid pipe configured to interconnect the evaporator and the condenser, a steam pipe configured to interconnect the evaporator and the condenser and to form a loop together with the liquid pipe, a porous body provided in the liquid pipe and configured to retain therein the liquid operating fluid, and a solid columnar support provided in the liquid pipe and configured to guide the operating fluid liquefied by the condenser to the porous body. At least one first groove is formed at a side surface of the columnar support.

10 Claims, 19 Drawing Sheets

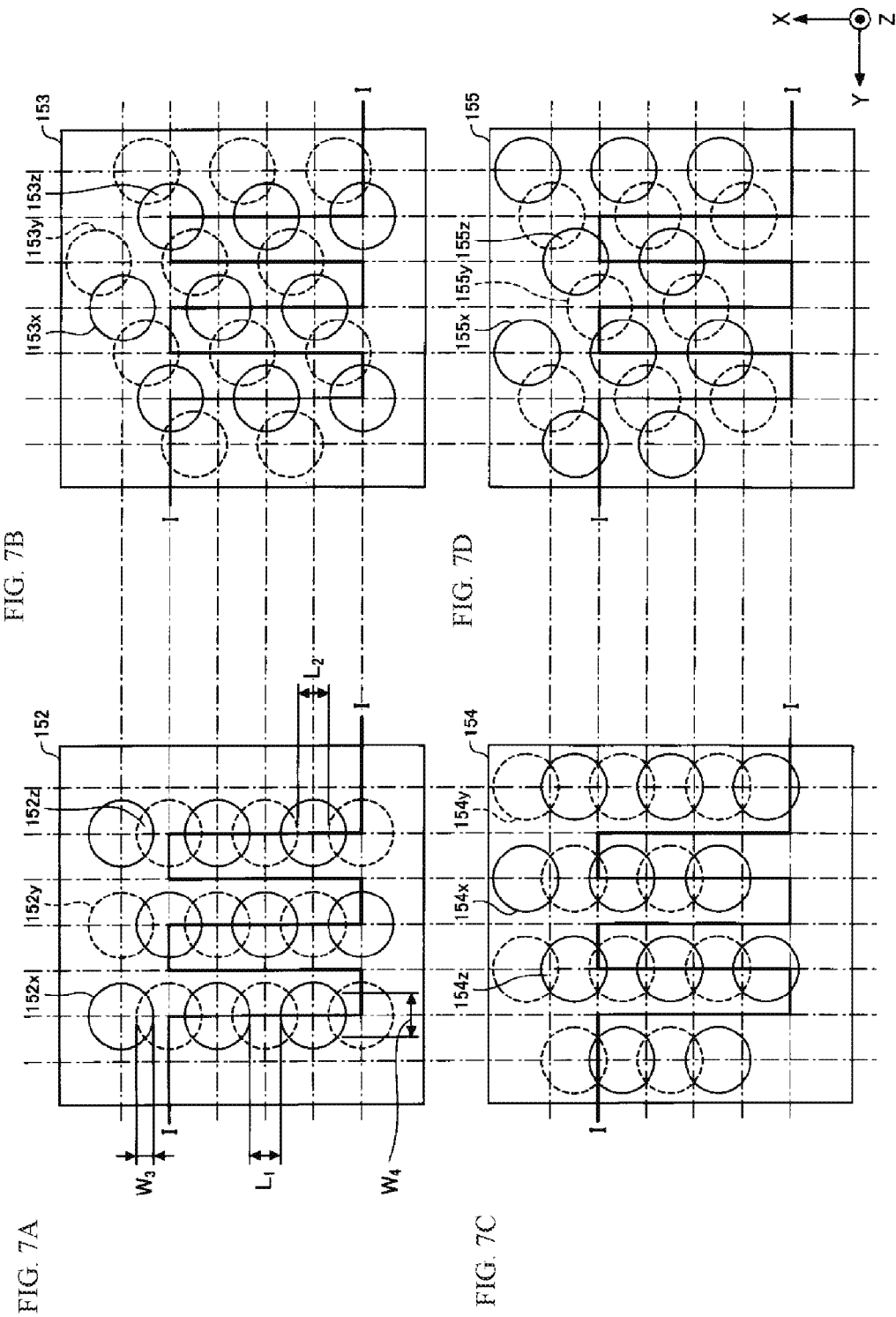

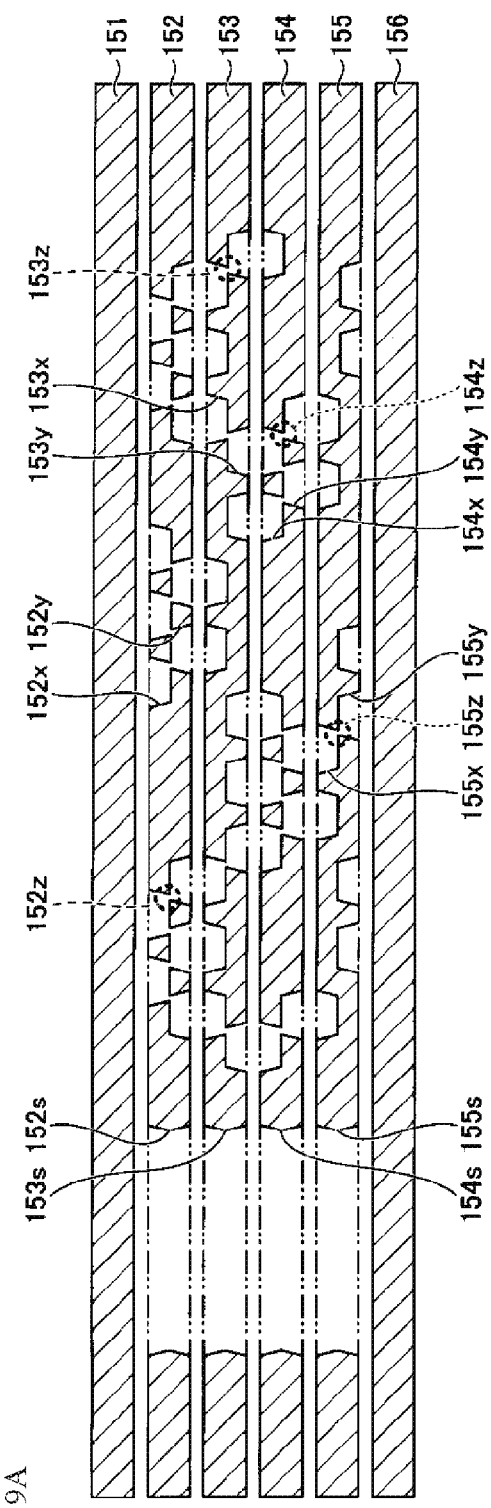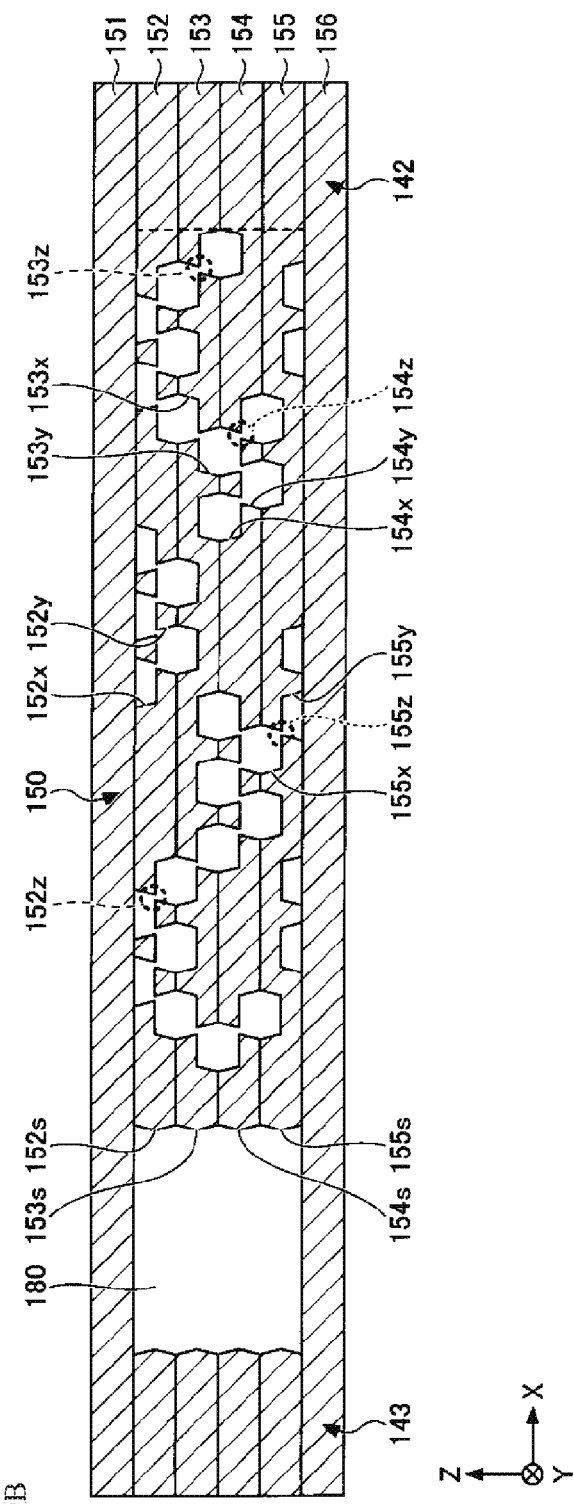

LOOP-TYPE HEAT PIPE

CROSS-REFERENCE TO RELATED APPLICATIONS

This application is based upon and claims the benefit of priority from prior Japanese patent application No. 2018-152494, filed on Aug. 13, 2018, the entire contents of which are incorporated herein by reference.

TECHNICAL FIELD

The present disclosure relates to a loop-type heat pipe.

BACKGROUND ART

A heat pipe has been known as a device for cooling a heat generation component such as a CPU (Central Processing Unit) and the like mounted on an electronic device. The heat pipe is a device configured to transport heat by using a phase change of an operating fluid.

As the heat pipe, a loop-type heat pipe may be exemplified which includes an evaporator configured to vaporize an operating fluid by heat of a heat generation component and a condenser configured to cool and liquefy the vaporized operating fluid. The evaporator and the condenser are interconnected by a liquid pipe and a steam pipe. The liquid pipe and the steam pipe are configured to form a loop-shaped flow channel. In the loop-type heat pipe, the operating fluid flows in one direction along the loop-shaped flow channel.

Also, the liquid pipe of the loop-type heat pipe is provided therein with a porous body, so that a capillary force generated in the porous body enables the operating fluid in the liquid pipe to be guided to the evaporator and prevents steam from flowing back from the evaporator to the liquid pipe. In the porous body, a plurality of fine pores is formed. The respective fine pores are formed by stacking metal layers having through-holes formed therein so that the through-holes are partially overlapped (for example, PTL 1).

Also, a loop-type heat pipe has been suggested in which a reservoir tank is provided between the liquid pipe and the evaporator so as to absorb a variation in a flow rate of the operating fluid (for example, refer to PTL 2).
[PTL 1]
Japanese Patent No. 6,146,484
[PTL 2]
JP-A-2015-183880

SUMMARY OF INVENTION

However, even with the loop-type heat pipe of the related art, it is not possible to sufficiently absorb the variation in the flow rate of the operating fluid in the liquid pipe during the use, so that dry-out may be caused.

Aspect of non-limiting embodiments of the present disclosure is to provide a loop-type heat pipe capable of suppressing dry-out.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

A loop-type heat pipe according to the present disclosure, comprises:
an evaporator configured to vaporize an operating fluid;
a condenser configured to liquefy the operating fluid;
a liquid pipe configured to interconnect the evaporator and the condenser;
a steam pipe configured to interconnect the evaporator and the condenser and to form a loop together with the liquid pipe;
a porous body provided in the liquid pipe and configured to retain therein the liquid operating fluid; and
a solid columnar support provided in the liquid pipe and configured to guide the operating fluid liquefied by the condenser to the porous body, wherein at least one first groove is formed at a side surface of the columnar support.

According to the disclosed technology, it is possible to suppress the dry-out.

BRIEF DESCRIPTION OF DRAWINGS

Exemplary embodiment(s) of the present disclosure will be described in detail based on the following figures, wherein:

FIGS. 7A to 7D are plan views exemplifying arrangement of bottomed holes included in a porous body of each of second to fifth metal layers.

FIGS. 9A and 9B are views exemplifying the manufacturing process of the loop-type heat pipe in accordance with the first exemplary embodiment (2 thereof).

DESCRIPTION OF EMBODIMENTS

Figure 1:
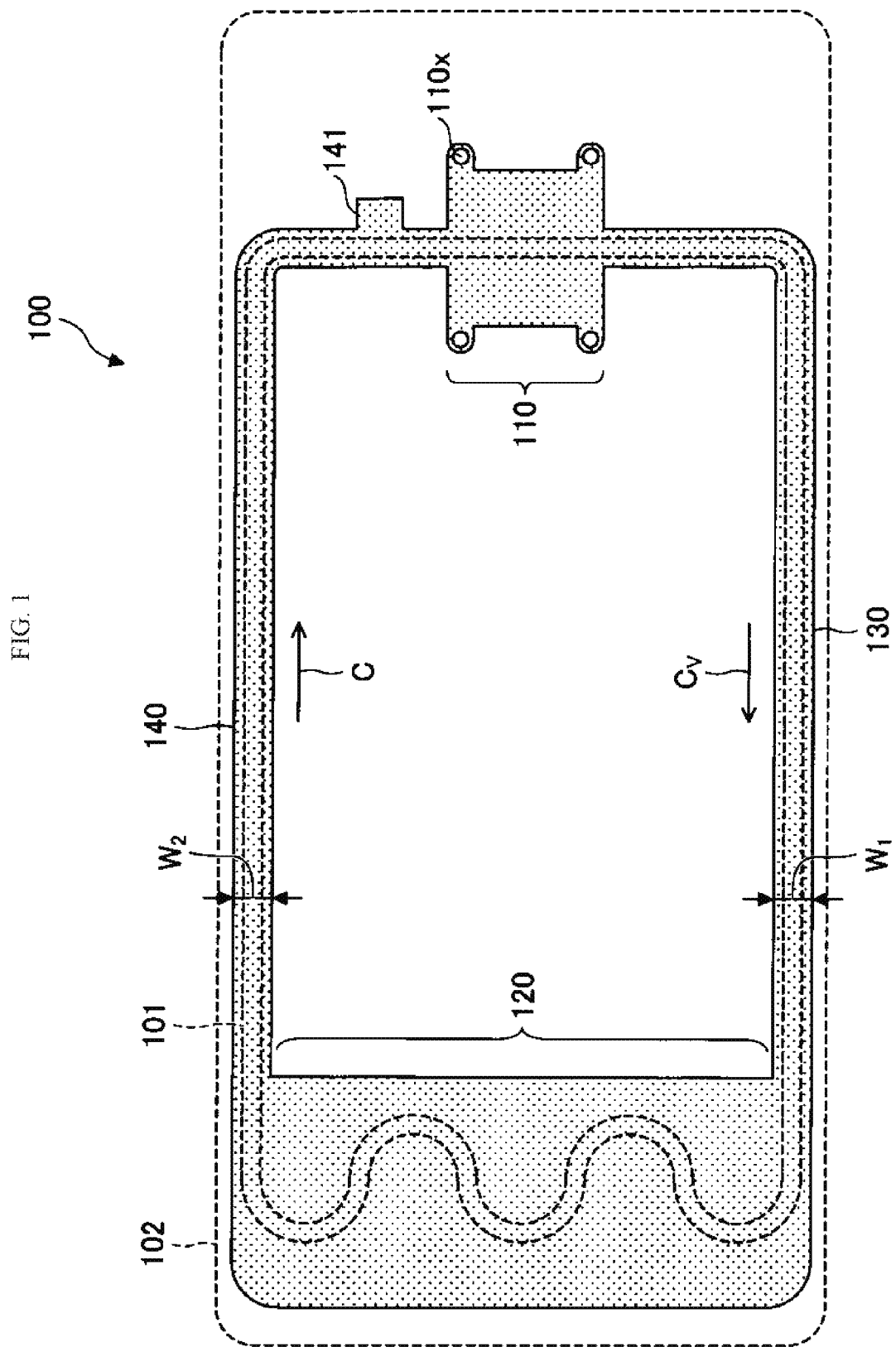
FIG. 1 is a schematic plan view depicting a loop-type heat pipe in accordance with a first exemplary embodiment.

Hereinafter, exemplary embodiments will be described in detail with reference to the accompanying drawings. In the specification and drawings, the constitutional elements having substantially the same functional configurations are denoted with the same reference numerals, and the overlapping descriptions thereof will be omitted.

First Exemplary Embodiment

A first exemplary embodiment is described. The first exemplary embodiment relates to a loop-type heat pipe.

[Structure of Loop-Type Heat Pipe]

FIG. 1 is a schematic plan view depicting a loop-type heat pipe in accordance with the first exemplary embodiment.

As shown in FIG. 1, a loop-type heat pipe 100 in accordance with the first exemplary embodiment includes an evaporator 110, a condenser 120, a steam pipe 130, and a liquid pipe 140. The loop-type heat pipe 100 may be accommodated in a mobile electronic device 102 such as a smart phone and a tablet terminal, for example.

In the loop-type heat pipe 100, the evaporator 110 has a function of vaporizing an operating fluid C to generate steam Cv. The condenser 120 has a function of liquefying the steam Cv of the operating fluid C. The evaporator 110 and the condenser 120 are connected by the steam pipe 130 and the liquid pipe 140. A flow channel 101, which is a loop in which the operating fluid C or the steam Cv is to flow, is formed by the steam pipe 130 and the liquid pipe 140.

The liquid pipe 140 is formed with an inlet 141 for injecting the operating fluid C. The inlet 141 is used to inject the operating fluid C and is closed after injecting the operating fluid C.

Figure 2:
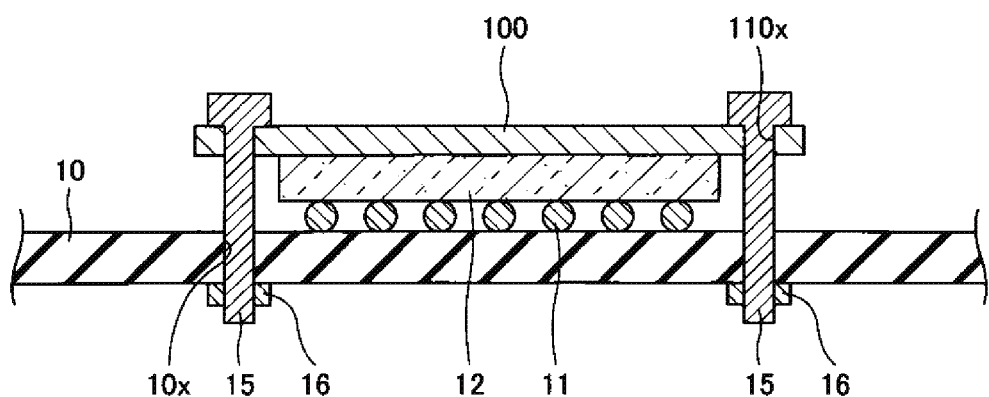
FIG. 2 is a sectional view depicting an evaporator and a surrounding thereof of the loop-type heat pipe in accordance with the first exemplary embodiment.

FIG. 2 is a sectional view depicting the evaporator and a surrounding thereof of the loop-type heat pipe in accordance with the first exemplary embodiment. As shown in FIGS. 1 and 2, the evaporator 110 is formed with four through-holes 110x, for example. A bolt 15 is inserted in each through-hole 110x of the evaporator 110 and each through-hole 10x of a circuit board 10 and is fixed by a nut 16 from a lower surface-side of the circuit board 10, so that the evaporator 110 and the circuit board 10 are fixed to each other.

The circuit board 10 is mounted thereon with a heat generation component 12 such as a CPU, for example, by bumps 11, and an upper surface of the heat generation component 12 is in close contact with a lower surface of the evaporator 110. The operating fluid C in the evaporator 110 is vaporized by heat generated from the heat generation component 12, so that the steam Cv is generated.

As shown in FIG. 1, the steam Cv generated in the evaporator 110 is guided to the condenser 120 through the steam pipe 130 and is liquefied in the condenser 120. Thereby, the heat generated from the heat generation component 12 moves to the condenser 120, so that an increase in temperature of the heat generation component 12 is suppressed. The operating fluid C liquefied in the condenser 120 is guided to the evaporator 110 through the liquid pipe 140. A width $W_1$ of the steam pipe 130 may be set to about 8 mm, for example. Also, a width $W_2$ of the liquid pipe 140 may be set to about 6 mm, for example. The width $W_1$ of the steam pipe 130 and the width $W_2$ of the liquid pipe 140 are not limited thereto, and may be the same, for example.

The kind of the operating fluid C is not particularly limited. However, a fluid having a high evaporation pressure and a high evaporative latent heat is preferably used so as to effectively cool the heat generation component 12 by the evaporative latent heat. As the fluid, for example, ammonia, water, Freon and acetone may be exemplified.

The evaporator 110, the condenser 120, the steam pipe 130, and the liquid pipe 140 may have a structure where a plurality of metal layers is stacked, for example (refer to FIGS. 4 to 6), respectively. The metal layers are copper layers having high heat conductivity, for example, and are directly bonded to each other by solid-phase bonding. A thickness of each metal layer may be set to about 50 μm to 200 μm, for example.

In the meantime, the metal layer is not limited to the copper layer and may be formed of stainless steel, aluminum, magnesium alloy and the like. Also, the number of metal layers to be stacked is not particularly limited.

Figure 3:
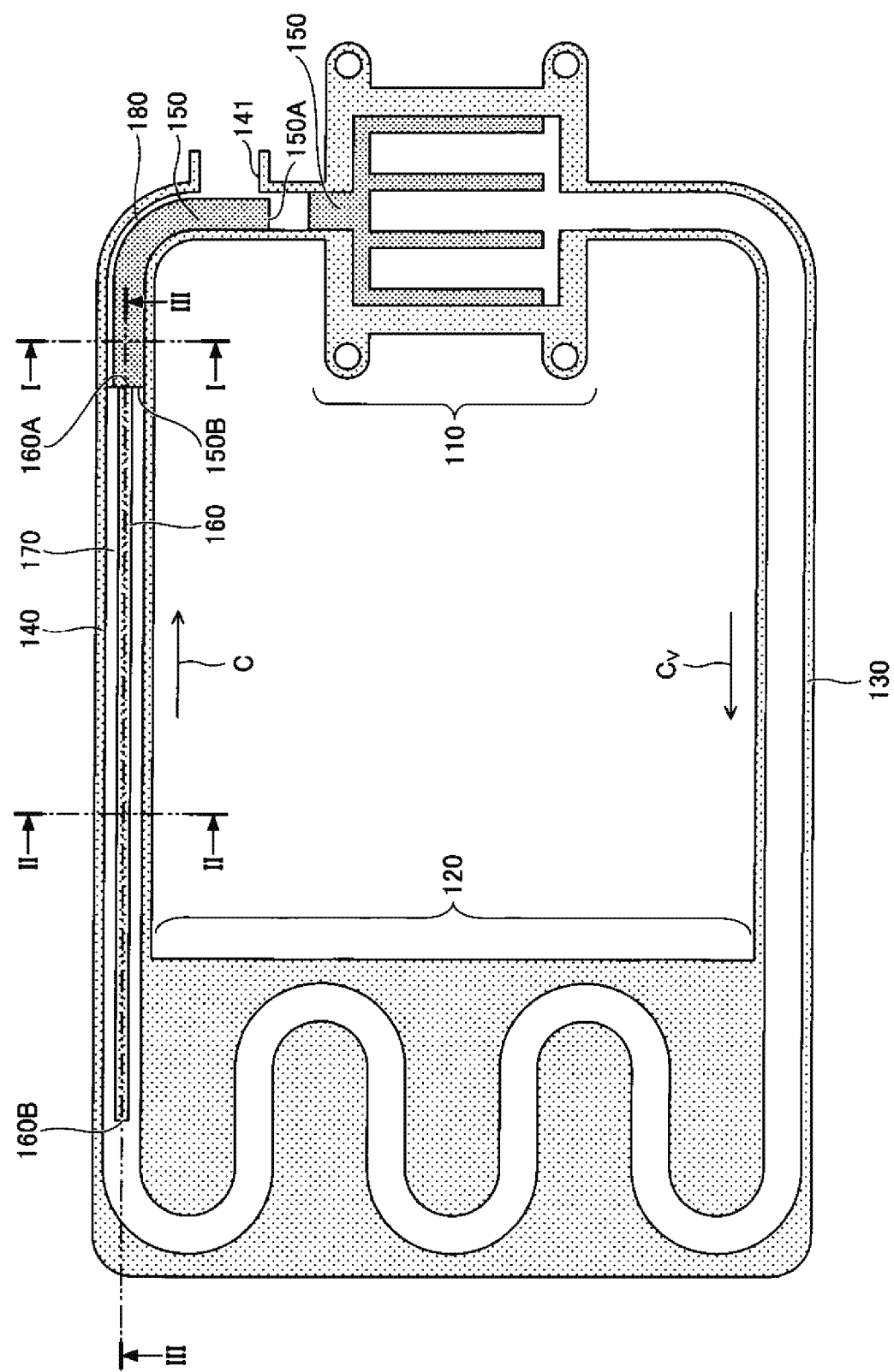
FIG. 3 is a schematic plan view exemplifying an internal configuration of the loop-type heat pipe in accordance with the first exemplary embodiment.

FIG. 3 is a schematic plan view exemplifying an internal configuration of the loop-type heat pipe in accordance with the first exemplary embodiment. In FIG. 3, a metal layer (a metal layer 151 shown in FIGS. 4 to 6), which is one outermost layer, is not shown.

As shown in FIG. 3, the liquid pipe 140 is provided therein with a porous body 150 in contact with an inner pipe wall 142, in the vicinity of the inlet 141. For example, the porous body 150 is integrally formed with being in contact with the pipe wall 142. The porous body 150 is configured to retain the liquid operating fluid C. One end portion 150A of the porous body 150 is located between the inlet 141 and the evaporator 110, and the other end portion 150B of the porous body 150 is located between the inlet 141 and the condenser 120, in a direction along the liquid pipe 140.

The porous body 150 is spaced from an outer pipe wall 143 of the liquid pipe 140, so that a communication flow channel 180 is formed between the porous body 150 and the pipe wall 143. The communication flow channel 180 is configured to communicate with the inlet 141.

A flow channel 170 consisting of a space surrounded by the pipe wall 142, the pipe wall 143, a metal layer (a metal layer 151 shown in FIGS. 4 to 6) becoming one outermost layer, and a metal layer (a metal layer 156 shown in FIGS. 4 to 6) becoming the other outermost layer is formed between the end portion 150B of the porous body 150 of the liquid pipe 140 and the condenser 120. The flow channel 170 is a part of the flow channel 101. The communication flow channel 180 is formed to communicate with the flow channel 170, so that the liquid operating fluid C injected into the liquid pipe 140 from the inlet 141 flows into the flow channel 170 through the communication flow channel 180.

The flow channel 170 is provided therein with a solid columnar support 160 extending along the liquid pipe 140. The columnar support 160 may have a structure where a plurality of metal layers is stacked (refer to FIGS. 4 to 6), like the evaporator 110, the condenser 120, the steam pipe 130, and the liquid pipe 140. The columnar support 160 is in contact with the metal layer (the metal layer 151 shown in FIGS. 4 to 6) becoming one outermost layer and the metal layer (a metal layer 156 shown in FIGS. 4 to 6) becoming the other outermost layer of the liquid pipe 140. One end portion 160A of the columnar support 160 is connected to the end portion 150B of the porous body 150, and the other end portion 160B is located in the vicinity of the condenser 120. The end portion 160B may be extended to the condenser 120 (i.e., the columnar support 160 may extend along the liquid pipe 140 from the porous body 150 to the condenser 120). The end portion 160B may be located in the condenser 120.

Figure 4:
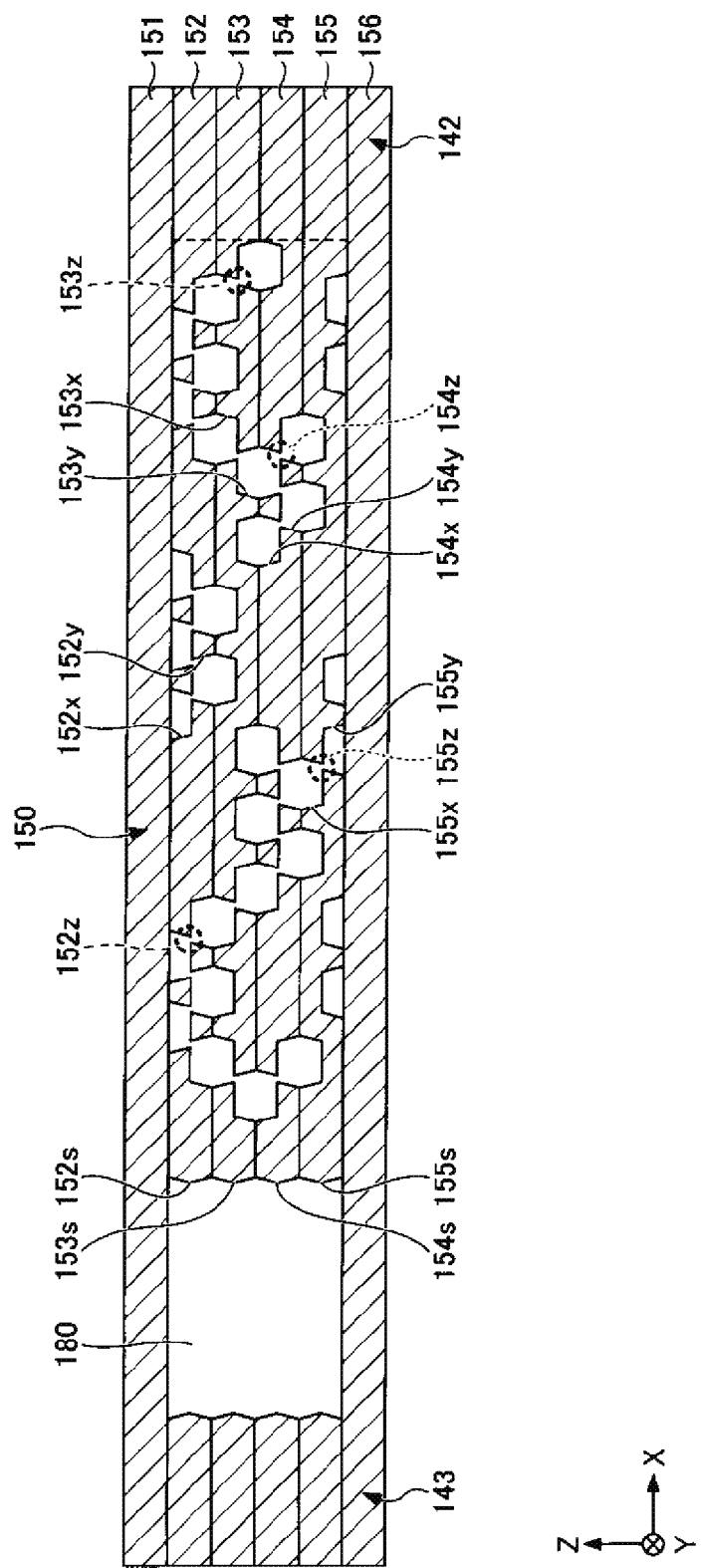
FIG. 4 is a sectional view exemplifying the internal configuration of the loop-type heat pipe in accordance with the first exemplary embodiment (1 thereof).
Figure 5:
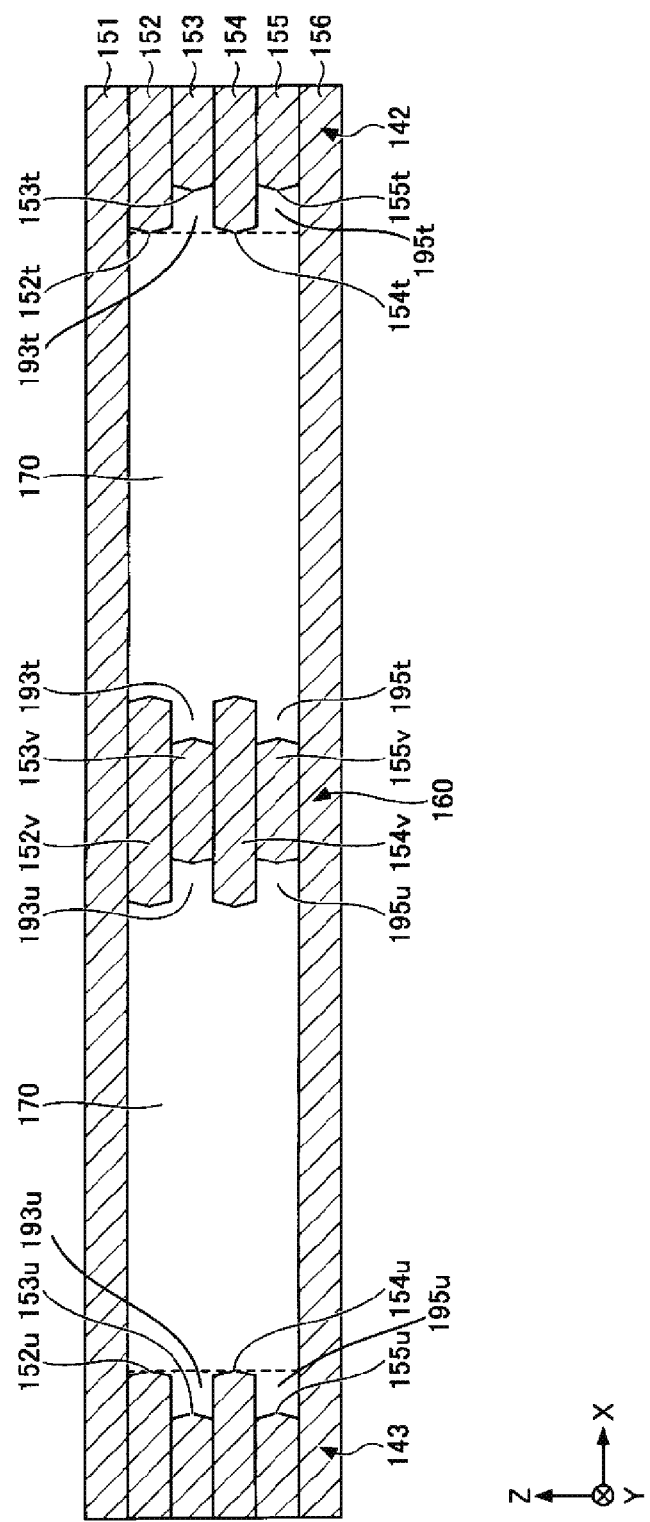
FIG. 5 is a sectional view exemplifying the internal configuration of the loop-type heat pipe in accordance with the first exemplary embodiment (2 thereof).
Figure 6:
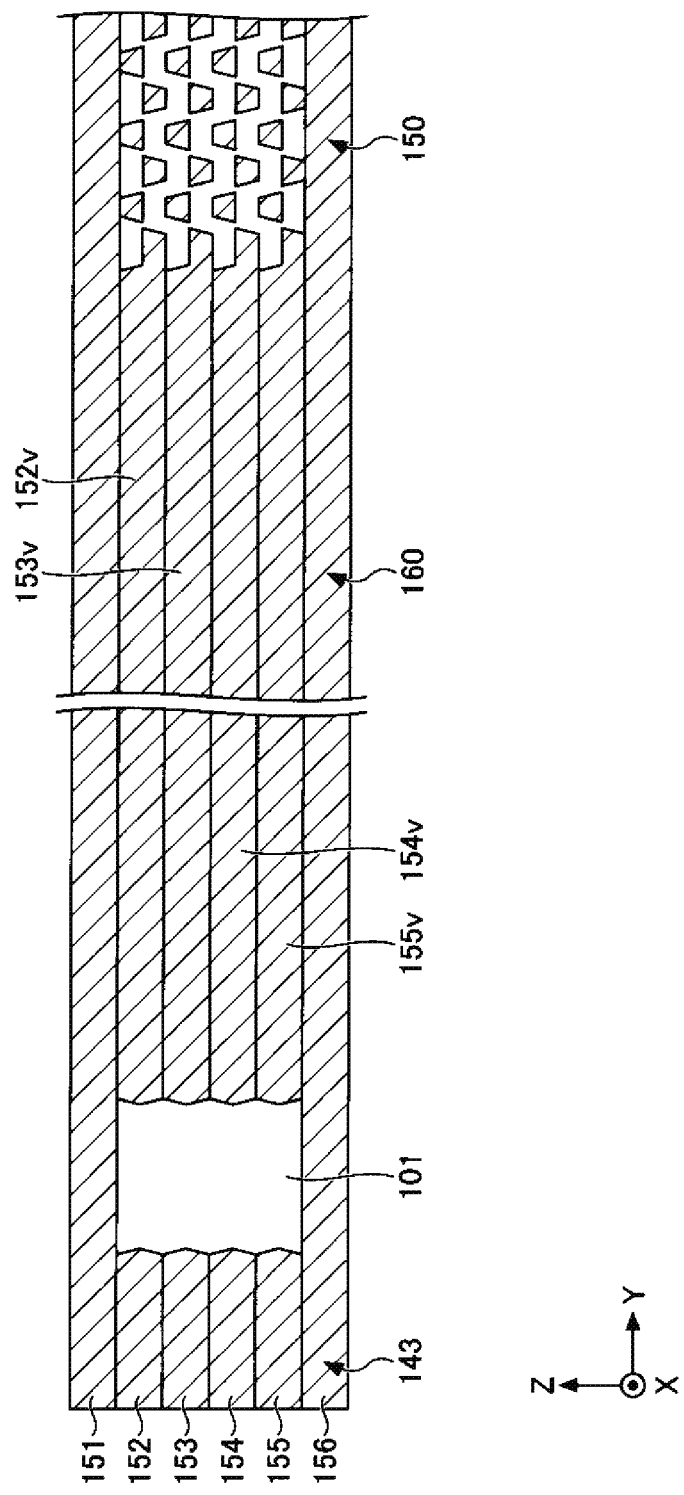
FIG. 6 is a sectional view exemplifying the internal configuration of the loop-type heat pipe in accordance with the first exemplary embodiment (3 thereof).

Here, the liquid pipe 140, the porous body 150, the columnar support 160, the flow channel 170 and the communication flow channel 180 are described in detail. FIGS. 4 to 6 are sectional views exemplifying an internal configuration of the loop-type heat pipe in accordance with the first exemplary embodiment. FIG. 4 is a sectional view taken along a line I-I of FIG. 3, FIG. 5 is a sectional view taken along a line II-II of FIG. 3, and FIG. 6 is a sectional view taken along a line III-III of FIG. 3. FIG. 7 is a plan view exemplifying arrangement of bottomed holes included in the porous body 150 of each of second to fifth metal layers. In FIG. 7, a part shown with a line I-I corresponds to a section of the porous body 150 in FIG. 4. In the meantime, an actual line I-I in a part of the porous body 150 of the line I-I shown in FIG. 3 is as shown in FIG. 7. Also, in FIG. 6, arrangements of bottomed holes and fine pores configuring the porous body 150 are simply shown.

The liquid pipe 140, the porous body 150 and the columnar support 160 may have a structure where six layers of metal layers 151 to 156 are stacked, for example, respectively. The metal layers 151 to 156 are copper layers having high heat conductivity, for example, and are directly bonded to each other by solid-phase bonding. A thickness of each of the metal layers 151 to 156 may be set to about 50 μm to 200 μm, for example. In the meantime, the metal layers 151 to 156 are not limited to the copper layers and may be formed of stainless steel, aluminum, magnesium alloy and the like. Also, the number of metal layers to be stacked is not particularly limited. For example, the five or less or seven or less metal layers may be stacked.

Meanwhile, in FIGS. 4 to 7D, a stacking direction of the metal layers 151 to 156 is denoted as a Z direction, a direction along the liquid pipe 140 in a plane perpendicular to the Z direction is denoted as a Y direction, and a direction perpendicular to the Y direction in the plane is denoted as an X direction (this applies to the other drawings).

In the liquid pipe 140, the porous body 150 and the columnar support 160, the metal layer 151 of the first layer (one outermost layer) and the metal layer 156 of the sixth layer (the other outermost layer) are not formed with a hole and a groove. In contrast, as shown in FIGS. 4 and 7A, in the porous body 150, the second metal layer 152 is formed with a plurality of bottomed holes 152x hollowed from an upper surface-side to a substantially central part in a thickness direction and a plurality of bottomed holes 152y hollowed from a lower surface-side to a substantially central part in the thickness direction.

The bottomed holes 152x and the bottomed holes 152y are alternately arranged in the X direction, as seen from above. Also, the bottomed holes 152x and the bottomed holes 152y are alternately arranged in the Y direction, as seen from above. The bottomed holes 152x and the bottomed holes 152y alternately arranged in the X direction are partially overlapped, as seen from above, and the overlapping portions communicate with each other, thereby forming fine pores 152z. The bottomed holes 152x and the bottomed holes 152y alternately arranged in the Y direction are formed with predetermined intervals, and are not overlapped, as seen from above. For this reason, the bottomed holes 152x and the bottomed holes 152y alternately arranged in the Y direction do not form fine pores. However, the present disclosure is not limited thereto. For example, the bottomed holes 152x and the bottomed holes 152y may be arranged in the Y direction so that they are overlapped to form the fine pores, as seen from above.

The bottomed holes 152x, 152y may be formed into a circular shape having a diameter of about 100 μm to 300 μm, for example, as seen from above. However, the bottomed holes may be formed to have any shape such as an elliptical shape, a polygonal shape and the like. A depth of each of the bottomed holes 152x, 152y may be set to about a half of a thickness of the metal layer 152, for example. An interval $L_1$ between the bottomed holes 152x adjacent to each other may be set to about 100 μm to 400 μm, for example. An interval $L_2$ between the bottomed holes 152y adjacent to each other may be set to about 100 μm to 400 μm, for example.

Figure 19:
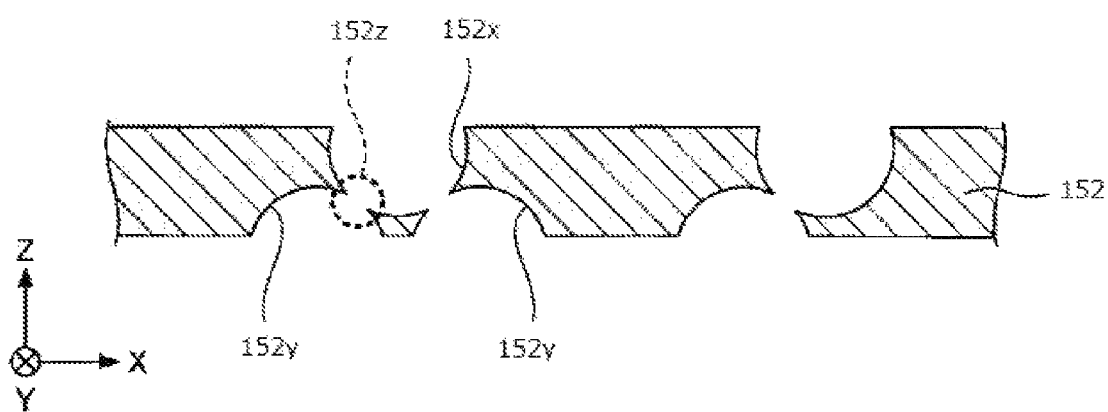
FIG. 19 is a view exemplifying another example of the bottomed holes in the porous body.

An inner wall of each of the bottomed holes 152x, 152y may be formed to have a tapered shape of which a width increases from a bottom surface toward an opening. However, the present disclosure is not limited thereto. For example, the inner wall of each of the bottomed holes 152x, 152y may be formed to be perpendicular to the bottom surface. Also, the inner wall of each of the bottomed holes 152x, 152y may be formed to have a curved semicircular shape (See FIG. 19). A width $W_3$ of the fine pore 152z in a width direction may be set to about 10 μm to 50 μm, for example. Also, a width $W_4$ of the fine pore 152z in a longitudinal direction may be set to about 50 μm to 150 μm, for example.

As shown in FIG. 4, the metal layer 152 is formed with an opening 152s, which configures the communication flow channel 180. The opening 152s is formed as a through-hole penetrating the metal layer 152 in the thickness direction (Z direction). This through-hole is formed by the bottomed hole at the upper surface-side and the bottomed hole at the lower surface-side, which are overlapped each other, as seen from above, and are interconnected, for example.

As shown in FIG. 5, the metal layer 152 is formed with openings 152t, 152u, which configure the flow channel 170. As shown in FIGS. 5 and 6, the metal layer 152 includes a solid part 152V configuring the columnar support 160, the opening 152t is formed at a side of the solid part 152V facing toward the pipe wall 142, and the opening 152u is formed at a side of the solid part 152V facing toward the pipe wall 143. The openings 152t, 152u are formed as through-holes penetrating the metal layer 152 in the thickness direction (Z direction). The through-holes are also formed by the bottomed holes at the upper surface-side and the bottomed holes at the lower surface-side, which are overlapped each other, as seen from above, and are interconnected, for example.

As shown in FIGS. 4 and 7B, in the porous body 150, the third metal layer 153 is formed with a plurality of bottomed holes 153x hollowed from an upper surface-side to a substantially central part in the thickness direction and a plurality of bottomed holes 153y hollowed from a lower surface-side to a substantially central part in the thickness direction.

In the metal layer 153, rows where only the bottomed holes 153x are aligned in the X direction and rows where only the bottomed holes 153y are aligned in the X direction are alternately aligned in the Y direction. In the rows alternately arranged in the Y direction, the bottomed holes 153x and the bottomed holes 153y of the adjacent rows are partially overlapped, as seen from above, and the overlapping portions communicate with each other, thereby forming fine pores 153z.

Central positions of the bottomed holes 153x and bottomed holes 153y adjacent to each other and forming the fine pores 153z are offset in the X direction. In other words, the bottomed holes 153x and bottomed holes 153y forming the fine pores 153z are alternately aligned in an oblique direction with respect to the X direction and the Y direction. The shapes and the like of the bottomed holes 153x, 153y and the fine pores 153z may be made to be the same the shapes and the like of the bottomed holes 152x and 152y and the fine pores 152z, for example.

The bottomed holes 152y of the metal layer 152 and the bottomed holes 153x of the metal layer 153 are formed at overlapping positions, as seen from above. For this reason, the fine pores are not formed at an interface between the metal layer 152 and the metal layer 153. However, the present disclosure is not limited thereto. For example, the arrangements of the bottomed holes 153x and the bottomed holes 153y in the X direction and the Y direction may be appropriately changed to form the fine pores at the interface between the metal layer 152 and the metal layer 153.

As shown in FIG. 4, the metal layer 153 is formed with an opening 153s, which configures the communication flow channel 180. The opening 153s is formed as a through-hole penetrating the metal layer 153 in the thickness direction (Z direction). This through-hole is formed by the bottomed hole at the upper surface-side and the bottomed hole at the lower surface-side, which are overlapped each other, as seen from above, and are interconnected, for example.

As shown in FIG. 5, the metal layer 153 is formed with openings 153t, 153u, which configure the flow channel 170. As shown in FIGS. 5 and 6, the metal layer 153 includes a solid part 153V configuring the columnar support 160, the opening 153t is formed at a side of the solid part 153V facing toward the pipe wall 142, and the opening 153u is formed at a side of the solid part 153V facing toward the pipe wall 143. The openings 153t, 153u are formed as through-holes penetrating the metal layer 153 in the thickness direction (Z direction). The through-holes are also formed by the bottomed holes at the upper surface-side and the bottomed holes at the lower surface-side, which are overlapped each other, as seen from above, and are interconnected, for example.

As shown in FIGS. 4 and 7C, in the porous body 150, the fourth metal layer 154 is formed with a plurality of bottomed holes 154x hollowed from an upper surface-side to a substantially central part in the thickness direction and a plurality of bottomed holes 154y hollowed from a lower surface-side to a substantially central part in the thickness direction.

The bottomed holes 154x and the bottomed holes 154y are alternately arranged in the X direction, as seen from above. Also, the bottomed holes 154x and the bottomed holes 154y are alternately arranged in the Y direction, as seen from above. The bottomed holes 154x and the bottomed holes 154y alternately arranged in the X direction are partially overlapped, as seen from above, and the overlapping portions communicate with each other, thereby forming fine pores 154z. The bottomed holes 154x and the bottomed holes 154y alternately arranged in the Y direction are formed with predetermined intervals, and are not overlapped, as seen from above. For this reason, the bottomed holes 154x and the bottomed holes 154y alternately arranged in the Y direction do not form fine pores. However, the present disclosure is not limited thereto. For example, the bottomed holes 154x and the bottomed holes 154y may be arranged in the Y direction so that they are overlapped to form the fine pores, as seen from above. The shapes and the like of the bottomed holes 154x, 154y and the fine pores 154z may be made to be the same the shapes and the like of the bottomed holes 152x and 152y and the fine pores 152z, for example.

The bottomed holes 153y of the metal layer 153 and the bottomed holes 154x of the metal layer 154 are formed at overlapping positions, as seen from above. For this reason, the fine pores are not formed at an interface between the metal layer 153 and the metal layer 154. However, the present disclosure is not limited thereto. For example, the arrangements of the bottomed holes 154x and the bottomed holes 154y in the X direction and the Y direction may be appropriately changed to form the fine pores at the interface between the metal layer 153 and the metal layer 154.

As shown in FIG. 4, the metal layer 154 is formed with an opening 154s, which configures the communication flow channel 180. The opening 154s is formed as a through-hole penetrating the metal layer 154 in the thickness direction (Z direction). This through-hole is formed by the bottomed hole at the upper surface-side and the bottomed hole at the lower surface-side, which are overlapped each other, as seen from above, and are interconnected, for example.

As shown in FIG. 5, the metal layer 154 is formed with openings 154t, 154u, which configure the flow channel 170. As shown in FIGS. 5 and 6, the metal layer 154 includes a solid part 154V configuring the columnar support 160, the opening 154t is formed at a side of the solid part 154V facing toward the pipe wall 142, and the opening 154u is formed at a side of the solid part 153V facing toward the pipe wall 143. The openings 154t, 154u are formed as through-holes penetrating the metal layer 154 in the thickness direction (Z direction). The through-holes are also formed by the bottomed holes at the upper surface-side and the bottomed holes at the lower surface-side, which are overlapped each other, as seen from above, and are interconnected, for example.

As shown in FIGS. 4 and 7D, in the porous body 150, the fifth metal layer 155 is formed with a plurality of bottomed holes 155x hollowed from an upper surface-side to a substantially central part in the thickness direction and a plurality of bottomed holes 155y hollowed from a lower surface-side to a substantially central part in the thickness direction.

In the metal layer 155, rows where only the bottomed holes 155x are aligned in the X direction and rows where only the bottomed holes 155y are aligned in the X direction are alternately aligned in the Y direction. In the rows alternately arranged in the Y direction, the bottomed holes 155x and the bottomed holes 155y of the adjacent rows are partially overlapped, as seen from above, and the overlapping portions communicate with each other, thereby forming fine pores 155z.

Central positions of the bottomed holes 155x and the bottomed holes 155y adjacent to each other and forming the fine pores 155z are offset in the X direction. In other words, the bottomed holes 155x and bottomed holes 155y forming the fine pores 155z are alternately aligned in an oblique direction with respect to the X direction and the Y direction. The shapes and the like of the bottomed holes 155x, 155y and the fine pores 155z may be made to be the same the shapes and the like of the bottomed holes 152x and 152y and the fine pores 152z, for example.

The bottomed holes 154y of the metal layer 154 and the bottomed holes 155x of the metal layer 155 are formed at overlapping positions, as seen from above. For this reason, the fine pores are not formed at an interface between the metal layer 154 and the metal layer 155. However, the present disclosure is not limited thereto. For example, the arrangements of the bottomed holes 155x and the bottomed holes 155y in the X direction and the Y direction may be appropriately changed to form the fine pores at the interface between the metal layer 154 and the metal layer 155.

As shown in FIG. 4, the metal layer 155 is formed with an opening 155s, which configures the communication flow channel 180. The opening 155s is formed as a through-hole penetrating the metal layer 155 in the thickness direction (Z direction). This through-hole is formed by the bottomed hole at the upper surface-side and the bottomed hole at the lower surface-side, which are overlapped each other, as seen from above, and are interconnected, for example.

As shown in FIG. 5, the metal layer 155 is formed with openings 155t, 155u, which configure the flow channel 170. As shown in FIGS. 5 and 6, the metal layer 155 includes a solid part 155V configuring the columnar support 160, the opening 155t is formed at a side of the solid part 155V facing toward the pipe wall 142, and the opening 155u is formed at a side of the solid part 155V facing toward the pipe wall 143. The openings 155t, 155u are formed as through-holes penetrating the metal layer 155 in the thickness direction (Z direction). The through-holes are also formed by the bottomed holes at the upper surface-side and the bottomed holes at the lower surface-side, which are overlapped each other, as seen from above, and are interconnected, for example.

The fine pores formed in the respective metal layers are formed to communicate with each other, and the fine pores communicating with each other are three-dimensionally distributed in the porous body 150. For this reason, the operating fluid C is three-dimensionally spread in the fine pores communicating with each other by the capillary force.

Also, as shown in FIG. 4, the openings 152s to 155s are formed at the overlapping positions, as seen from above, and the communication flow channel 180 is configured by the openings 152s to 155s.

Also, as shown in FIG. 5, as seen from above, the openings 152t to 155t are formed to be alternately offset in the X direction. That is, the openings 153t, 155t are formed larger than the openings 152t, 154t in the X direction, and the side surfaces of the openings 153t, 155t are more retreated than the side surfaces of the openings 152t, 154t at both sides of the pipe wall 142 and the columnar support 160. Like this, the positions of the side surfaces of the openings 153t, 155t in the X direction and the positions of the side surfaces of the openings 152t, 154t in the X direction are offset, so that the metal layer 153 is formed with a groove 193t and the metal layer 155 is formed with a groove 195t. For example, the grooves 193t, 195t are formed to extend along the liquid pipe 140 (to extend in substantially parallel with the flow channel 170, in the Y direction).

Likewise, as shown in FIG. 5, as seen from above, the openings 152u to 155u are formed to be alternately offset in the X direction. That is, the openings 153u, 155u are formed larger than the openings 152u, 154u in the X direction, and the side surfaces of the openings 153u, 155u are more retreated than the side surfaces of the openings 152u, 154u at both sides of the pipe wall 143 and the columnar support 160. Like this, the positions of the side surfaces of the openings 153u, 155u in the X direction and the positions of the side surfaces of the openings 152u, 154u in the X direction are offset, so that the metal layer 153 is formed with a groove 193u and the metal layer 155 is formed with a groove 195u. For example, the grooves 193u, 195u are formed to extend along the liquid pipe 140 (to extend in substantially parallel with the flow channel 170, in the Y direction).

In this way, the wall surfaces of the liquid pipe 140 and the side surfaces of the columnar support 160 are formed with the grooves 193t, 193u, 195t, 195u, so that the liquid operating fluid C in the flow channel 170 of the liquid pipe 140 is guided from the condenser 120 toward the evaporator 110 by the capillary force generated in the grooves 193t, 193u, 195t, 195u.

Also, the porous body 150 is provided between the flow channel 170 and the evaporator 110 in the vicinity of the inlet 141. Therefore, the liquid operating fluid C injected from the inlet 141 into the liquid pipe 140 is absorbed and retained by the porous body 150. Also, after the loop-type heat pipe 100 starts an operation, the liquid operating fluid C guided toward the evaporator 110 by the grooves 193t, 193u, 195t, 195u is absorbed and retained by the porous body 150 before it reaches the evaporator 110.

When an amount of heat applied to the evaporator 110 increases, a rate at which the evaporator 110 generates the steam Cv may exceed a rate at which the condenser 120 liquefies the steam Cv to generate the liquid operating fluid C. In this case, an amount of the liquid operating fluid C in the flow channel 170 decreases. However, in the first exemplary embodiment, since the porous body 150 located closer to the evaporator 110 than the flow channel 170 retains therein the liquid operating fluid C, even though the amount of the liquid operating fluid C in the flow channel 170 decreases, the liquid operating fluid C can be continuously supplied from the porous body 150 to the evaporator 110. That is, according to the first exemplary embodiment, it is possible to suppress the dry-out that is caused as the operating fluid C in the liquid pipe 140 is depleted.

Also, while the loop-type heat pipe 100 is used, for example, when the condenser 120 is located vertically below the evaporator 110, the gravity by which the operating fluid C is to flow toward the condenser 120 is applied. However, in the first exemplary embodiment, since the porous body 150 retains therein the operating fluid C, it is possible to continuously supply the liquid operating fluid C from the porous body 150 to the evaporator 110, thereby suppressing the dry-out.

Even when a porous columnar support is used instead of the solid columnar support 160, it is possible to guide the liquid operating fluid C in the flow channel 170 of the liquid pipe 140 from the condenser 120 toward the evaporator 110. However, the solid columnar support 160 is more advantageous than the porous columnar support, in the following respects.

First, the solid columnar support 160 can be formed to be narrower than the porous columnar support. For example, while the solid columnar support 160 can be easily formed to have a width of about 100 μm, it is structurally difficult to form the porous columnar support having a width of about 100 μm. In a case where a width and a height of the flow channel 170 are the same, the larger the columnar support provided therein is, an area within which the operating fluid C can flow in the flow channel 170 becomes smaller. Also, the smaller a sectional area perpendicular to the flowing direction of the operating fluid C is, the greater a pressure loss in the flow channel 170 is. Therefore, the solid columnar support 160 that can be formed to have a narrow width is more advantageous than the porous columnar support, from a standpoint of reduction in pressure loss.

Second, when the material is the same, the solid columnar support 160 has mechanical strength higher than the porous columnar support. For example, comparing the solid columnar support 160 and the porous columnar support, which are made of copper, the solid columnar support 160 has strength remarkably higher than the porous columnar support. Therefore, the solid columnar support 160 is more advantageous than the porous columnar support, from a standpoint of the mechanical strength.

Also, even though the steam Cv intends to flow back in the liquid pipe 140 as the heat is leaked from the evaporator 110, the steam Cv can be pushed and returned by the capillary force that is applied from the porous body 150 to the liquid operating fluid C, so that the backflow of the steam Cv can be prevented. In FIG. 3, the porous body 150 is spaced from the pipe wall 143. This is particularly effective in preventing the backflow of the steam Cv when the porous body 150 is in contact with the pipe wall 143 in the vicinity of the evaporator 110 and a part of the porous body 150 fills the inside of the liquid pipe 140.

Also, the porous body 150 is provided in the evaporator 110. The liquid operating fluid C is infiltrated into a part, which is close to the liquid pipe 140, of the porous body 150 in the evaporator 110. At this time, the capillary force that is applied from the porous body 150 to the operating fluid C is a pumping force by which the operating fluid C is to be circulated in the loop-type heat pipe 100.

Further, since the capillary force opposes the steam Cv in the evaporator 110, it is possible to suppress the steam Cv from flowing back to the liquid pipe 140.

In the meantime, although the liquid pipe 140 is formed with the inlet 141 for injecting the operating fluid C, the inlet 141 is closed, so that the inside of the loop-type heat pipe 100 is hermetically kept.

[Manufacturing Method of Loop-Type Heat Pipe]

Subsequently, a manufacturing method of the loop-type heat pipe in accordance with the first exemplary embodiment is described, focusing on a manufacturing process of the porous body. FIGS. 8A to 11B exemplify a manufacturing process of the loop-type heat pipe in accordance with the first exemplary embodiment. FIGS. 8A to 9B depict a section corresponding to FIG. 4, and FIGS. 10 and 11 depict a section corresponding to FIG. 5.

Figure 8A:
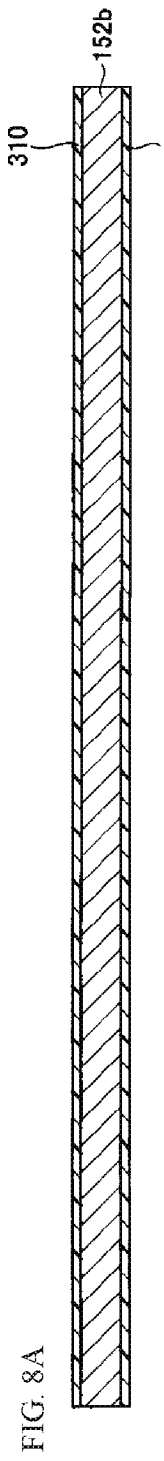
FIGS. 8A to 8D are views exemplifying a manufacturing process of the loop-type heat pipe in accordance with the first exemplary embodiment (1 thereof).
Figure 10A:
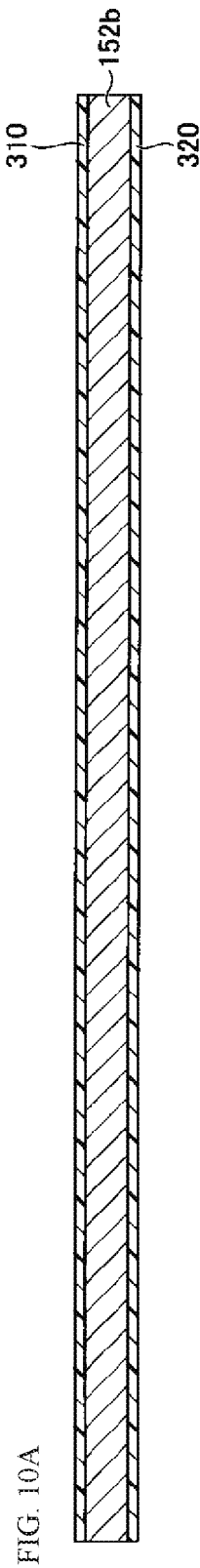
FIGS. 10A to 10D are views exemplifying the manufacturing process of the loop-type heat pipe in accordance with the first exemplary embodiment (3 thereof).

First, in processes shown in FIGS. 8A and 10A, a metal sheet 152b formed into a planar shape of FIG. 1 is prepared. Then, a resist layer 310 is formed on an upper surface of the metal sheet 152b, and a resist layer 320 is formed on a lower surface of the metal sheet 152b. The metal sheet 152b is a member that is finally to be the metal layer 152, and may be formed of, for example, copper, stainless steel, aluminum, magnesium alloy or the like. A thickness of the metal sheet 152b may be set to about 50 μm to 200 μm, for example. As the resist layers 310, 320, a photosensitive dry film resist or the like may be used, for example.

Subsequently, in processes shown in FIGS. 8B and 10B, the resist layer 310 is exposed and developed to form openings 310x for selectively exposing the upper surface of the metal sheet 152b, in a region in which the porous body 150 of the metal sheet 152b is to be formed. Also, the resist layer 320 is exposed and developed to form openings 320x for selectively exposing the lower surface of the metal sheet 152b. The openings 310x, 320x are formed and arranged so as to correspond to the shapes and arrangements of the bottomed holes 152x, 152y shown in FIG. 7A.

Figure 8B:
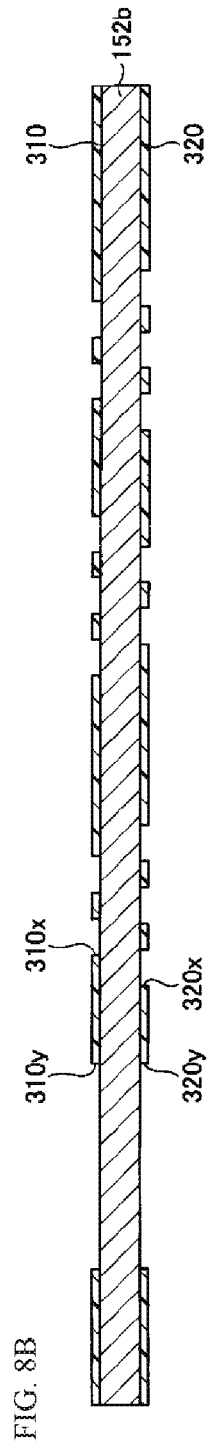
Figure 10B:
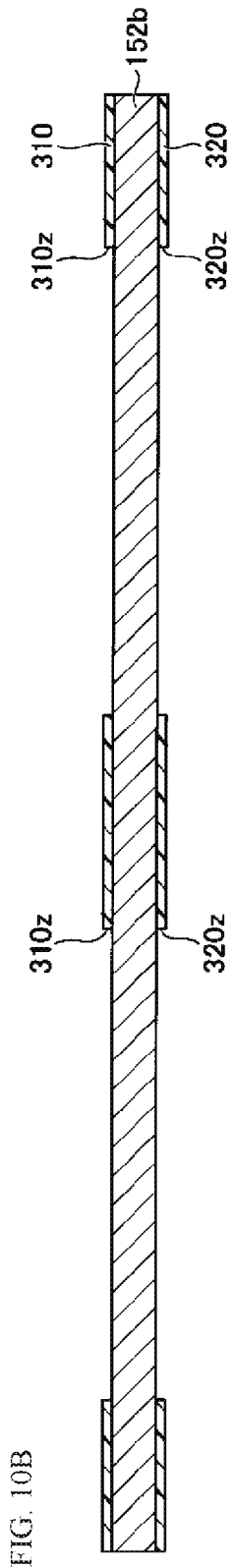

When exposing and developing the resist layer 310, as shown in FIG. 8B, openings 310y for selectively exposing the upper surface of the metal sheet 152b are also formed in a region in which the communication flow channel 180 is to be formed, and as shown in FIG. 10B, openings 310z for selectively exposing the upper surface of the metal sheet 152b are also formed in a region in which the flow channel 170 is to be formed. Also, when exposing and developing the resist layer 320, as shown in FIG. 8B, openings 320y for selectively exposing the lower surface of the metal sheet 152b are also formed in a region in which the communication flow channel 180 is to be formed, and as shown in FIG. 10B, openings 320z for selectively exposing the lower surface of the metal sheet 152b are also formed in a region in which the flow channel 170 is to be formed.

Figure 8C:
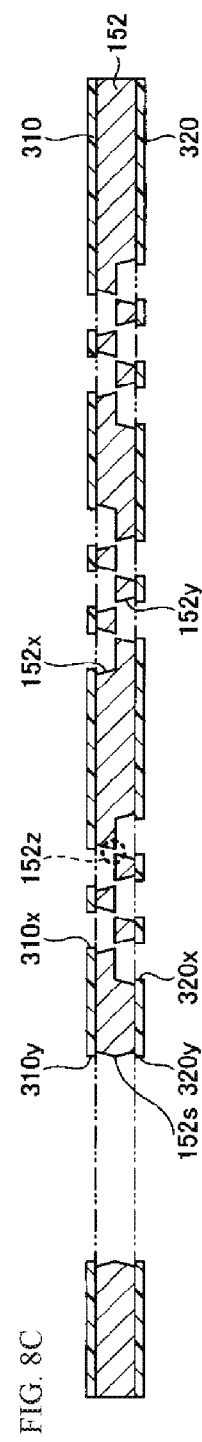
Figure 10C:
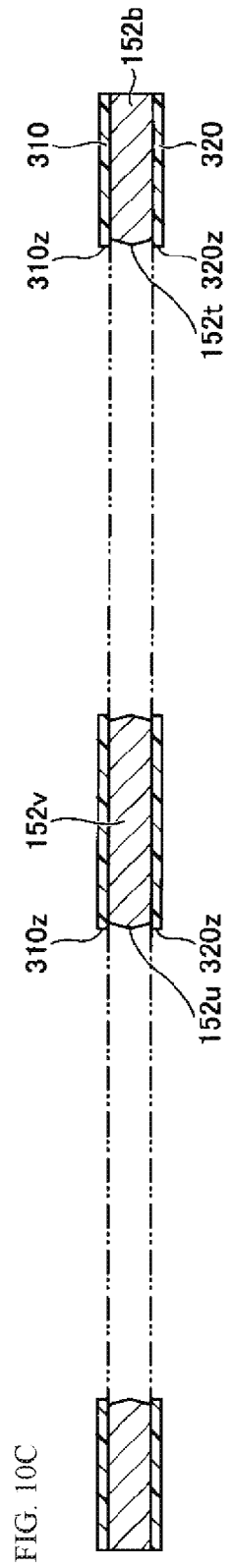

Subsequently, in processes shown in FIGS. 8C and 10C, the metal sheet 152b exposed into the openings 310x, 310y, 310z is half-etched from the upper surface of the metal sheet 152b, and the metal sheet 152b exposed into the openings 320x, 320y, 320z is half-etched from the lower surface of the metal sheet 152b. Thereby, the bottomed holes 152x are formed in the upper surface of the metal sheet 152b, the bottomed holes 152y are formed in the lower surface, and the openings 152s, 152t, 152u penetrating the metal sheet 152b are formed. Also, since the openings 310x and the openings 320x alternately arranged in the X direction in the front and back surfaces are partially overlapped, as seen from above, the overlapping portions communicate with each other, thereby forming the fine pores 152z. When half etching the metal sheet 152b, a ferric chloride solution may be used, for example.

Figure 8D:
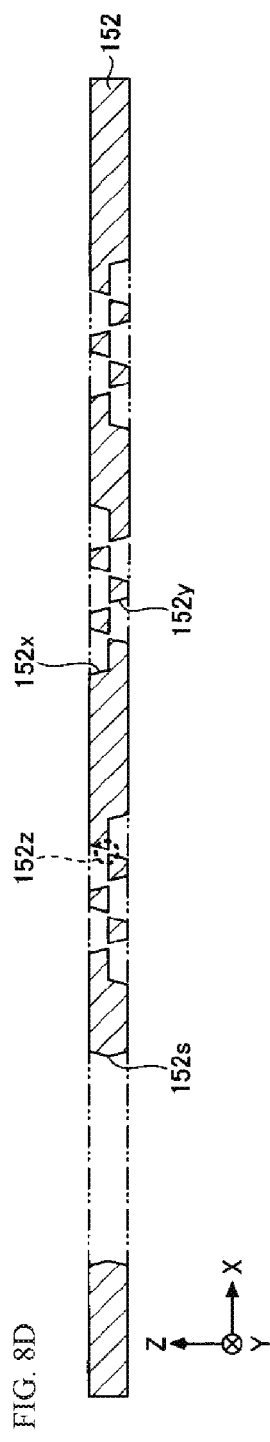
Figure 10D:
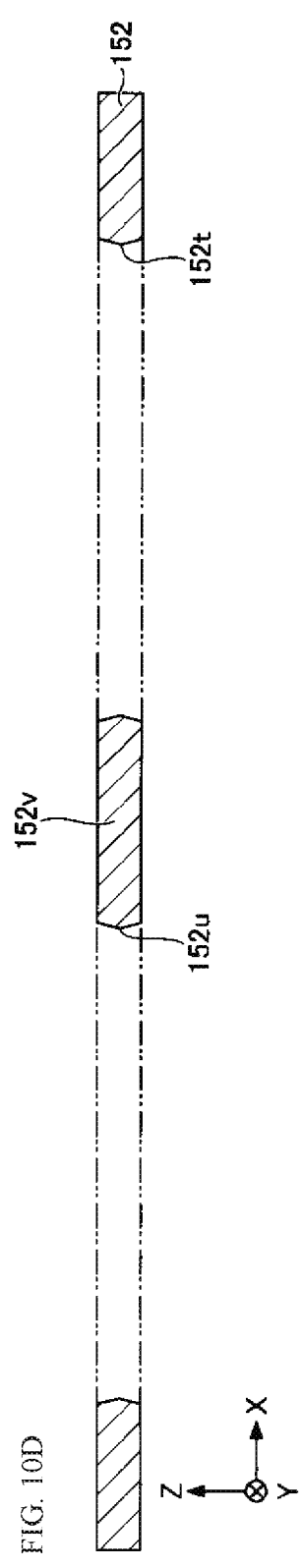

Subsequently, in processes shown in FIGS. 8D and 10D, the resist layers 310, 320 are removed by a removing solution. Thereby, the metal layer 152 is completed.

Figure 11A:
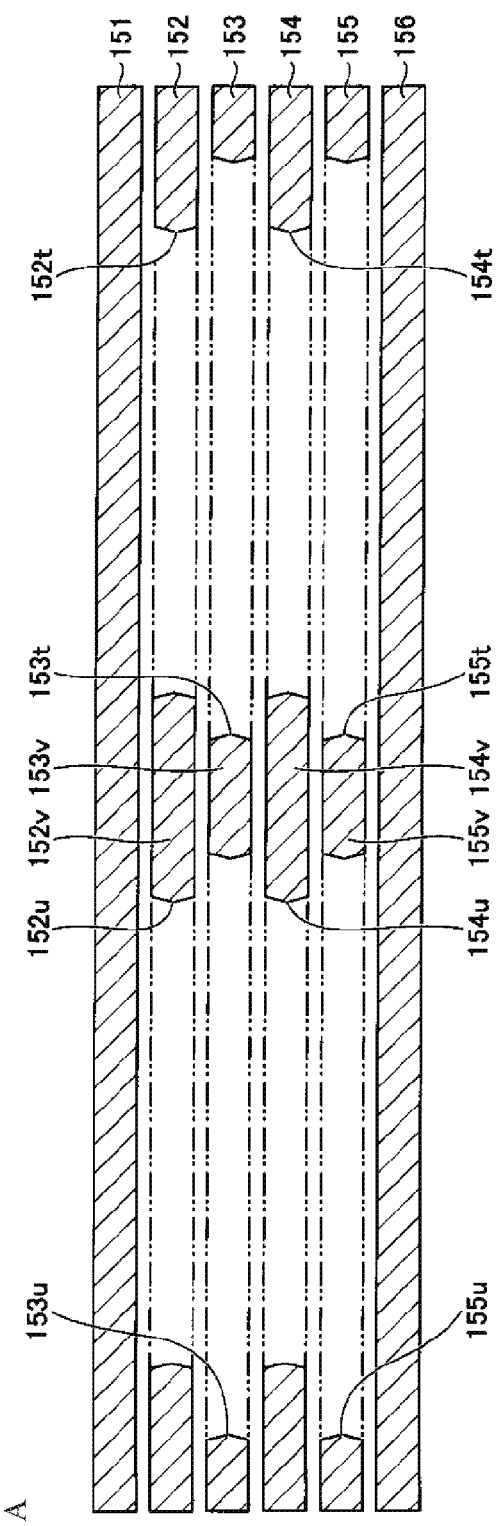
FIGS. 11A and 11B are views exemplifying the manufacturing process of the loop-type heat pipe in accordance with the first exemplary embodiment (4 thereof).
Figure 11B:
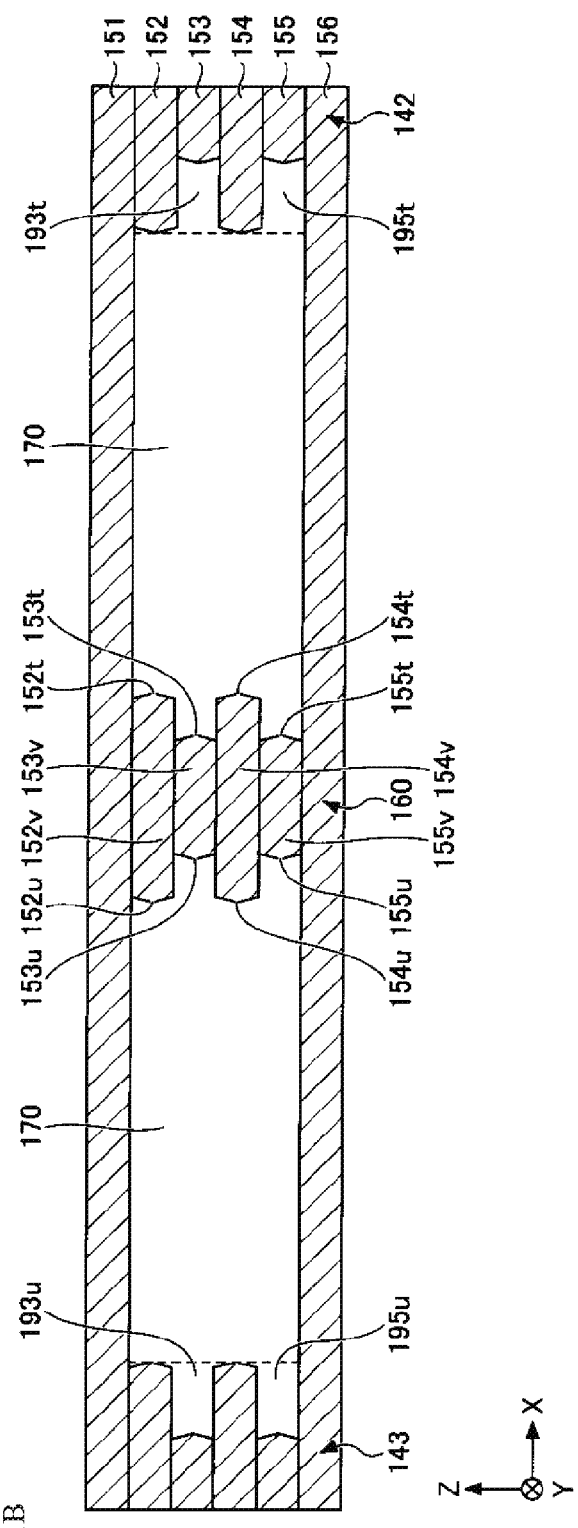

Subsequently, in processes shown in FIGS. 9A and 11A, solid metal layers 151, 156 having no holes and grooves are prepared. Also, the metal layers 153, 154, 155 are formed by the same method as the metal layer 152. The positions of the bottomed holes, the fine pores and the openings formed in the metal layers 153, 154, 155 are as shown in FIG. 7, for example.

Subsequently, in processes shown in FIGS. 9B and 11B, the respective metal layers are stacked in order shown in FIGS. 9A and 11A, and are then pressurized and heated for solid-phase bonding. Thereby, the metal layers adjacent to each other are directly bonded, so that the evaporator 110, the condenser 120, the steam pipe 130, and the liquid pipe 140 are formed and the evaporator 110 and the liquid pipe 140 are formed therein with the porous body 150. Also, the end portion 150B of the porous body 150 facing toward the condenser 120 is formed with the fine flow channel 170 consisting of the space for guiding the operating fluid C to the porous body 150, and the communication flow channel 180 is formed between the outer pipe wall 143 of the liquid pipe 140 and the porous body 150. Also, the flow channel 170 is formed therein with the solid columnar support 160 of which the end portion 160A is connected to the end portion 150B.

Thereafter, the liquid pipe 140 is exhausted by using a vacuum pump and the like, and the operating fluid C is injected from the inlet 141 into the liquid pipe 140. The operating fluid C injected into the liquid pipe 140 is permeated into the porous body 150 and flows into the flow channel 170 through the communication flow channel 180. After injecting the operating fluid C, the inlet 141 is closed.

Here, the solid-phase bonding is a method of heating and softening targets to be bonded in a solid-phase (solid) state without melting the same, and pressurizing, plastically deforming and bonding the same. In the meantime, all materials of the metal layers 151 to 156 are preferably the same so that the metal layers adjacent to each other can be favorably bonded by the solid-phase bonding.

In this way, the loop-type heat pipe 100 can be manufactured.

The bottomed holes formed from both sides of the respective metal layers are made to partially communicate with each other, so that the fine pores are formed in the respective metal layers. By this structure, it is possible to secure more excellent stability, as compared to the formation method of the fine pores of the related art in which the metal layers having the through-holes formed therein are stacked so that the through-holes partially overlap. That is, it is possible to form the fine pores having predetermined sizes in the metal layers without the positional deviation upon stacking of the metal layers and the positional deviation due to expansion and shrinkage of the metal layers upon heart treatment when stacking the metal layers.

Thereby, it is possible to prevent the capillary force, which is applied by the fine pores, from being lowered due to the fine pores having non-uniform sizes, and to stably suppress the steam Cv from flowing back from the evaporator 110 to the liquid pipe 140.

Also, in the part at which the metal layers are stacked, the entire bottomed holes adjacent to each other are overlapped to increase the contact area of the metal layers, so that it is possible to secure the strong bonding.

Also, according to the manufacturing method, the bottomed holes and the fine pores configuring the porous body 150 and the through-holes configuring the flow channel 170 and the communication flow channel 180 can be concurrently formed.

Modified Embodiment of First Exemplary Embodiment

Figure 12:
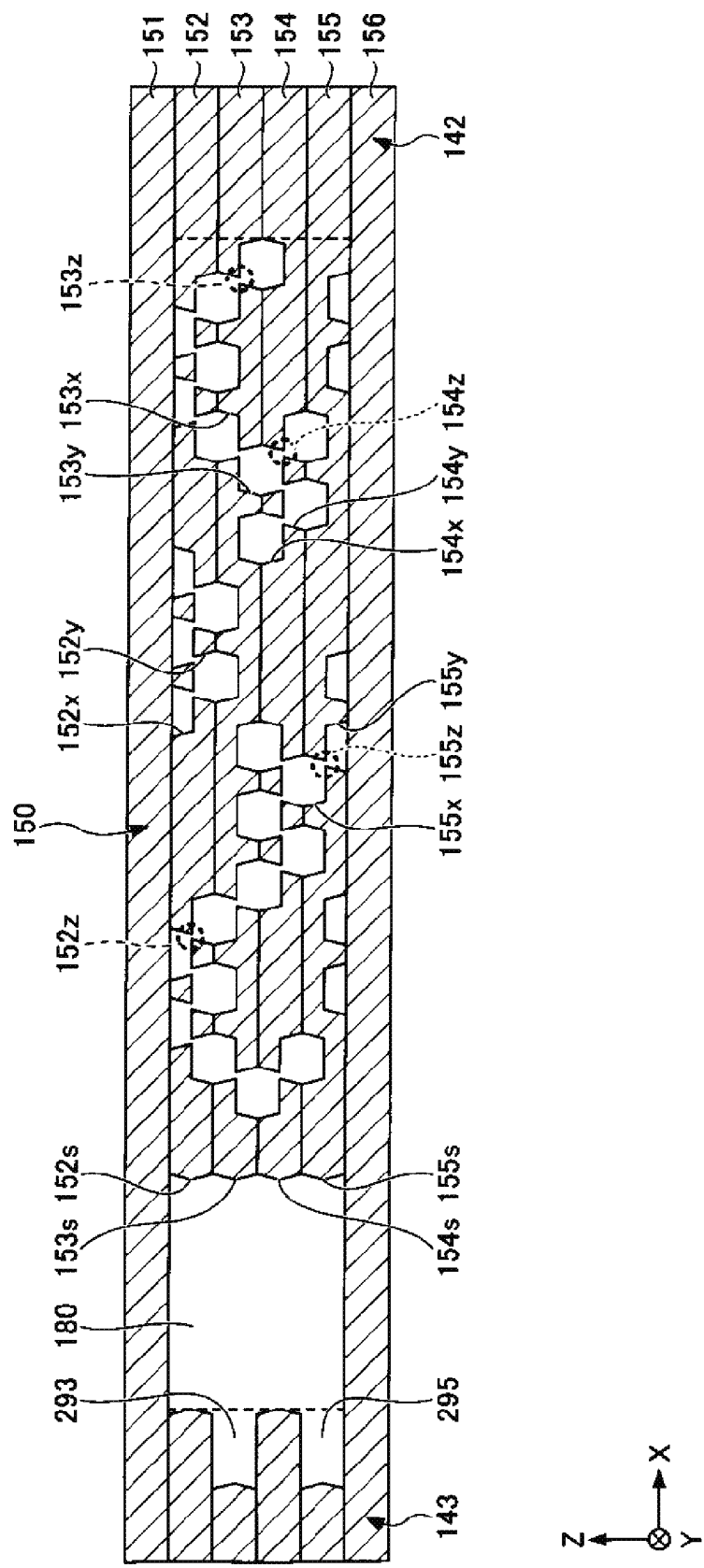
FIG. 12 is a schematic plan view exemplifying an internal configuration of a loop-type heat pipe in accordance with a modified embodiment of the first exemplary embodiment.

In the below, a modified embodiment of the first exemplary embodiment is described. The modified embodiment of the first exemplary embodiment is different from the first exemplary embodiment, in terms of the configuration of the communication flow channel 180. FIG. 12 is a sectional view exemplifying an internal configuration of a loop-type heat pipe in accordance with the modified embodiment of the first exemplary embodiment. FIG. 12 is equivalent to a sectional view taken along a line I-I of FIG. 3.

The loop-type heat pipe in accordance with the modified embodiment of the first exemplary embodiment includes the liquid pipe 140, the porous body 150, the columnar support 160, the flow channel 170 and the communication flow channel 180, like the loop-type heat pipe 100 of the first exemplary embodiment.

However, as shown in FIG. 12, as seen from above, openings 152s to 155s are formed to be alternately offset in the X direction. That is, the openings 153s, 155s are formed larger than the openings 152s, 154s in the X direction, and the side surfaces of the openings 153s, 155s are more retreated than the side surfaces of the openings 152s, 154s at the pipe wall 143-side. In this way, the positions of the side surfaces of the openings 153s, 155s in the X direction and the positions of the side surfaces of the openings 152s, 154s in the X direction are offset, so that the metal layer 153 is formed with a groove 293 and the metal layer 155 is formed with a groove 295. For example, the grooves 293, 295 are formed to extend along the liquid pipe 140 (to extend in substantially parallel with the communication flow channel 180 in the Y direction).

The other configurations are the same as the first exemplary embodiment.

Even with the modified embodiment, it is possible to accomplish the same effects as the first exemplary embodiment. Also, since the grooves 293, 295 are formed in the wall surface of the communication flow channel 180, the flowing of the liquid operating fluid C is promoted by the grooves 293, 295. Therefore, it is possible to more rapidly guide the operating fluid C injected from the inlet 141 to the flow channel 170.

For example, the groove 293 can be concurrently formed with the bottomed holes 153x, 153y, as follows. That is, resist layers that are formed on an upper surface and a lower surface of a metal sheet finally becoming the metal layer 153 are formed with openings having a planar shape conforming to the groove 293, and the metal sheet is then half etched. In this way, the groove 293 can be concurrently formed with the bottomed holes 153x, 153y. Like the groove 293, the groove 295 can be concurrently formed with the bottomed holes 155x, 155y.

Second Exemplary Embodiment

Figure 13:
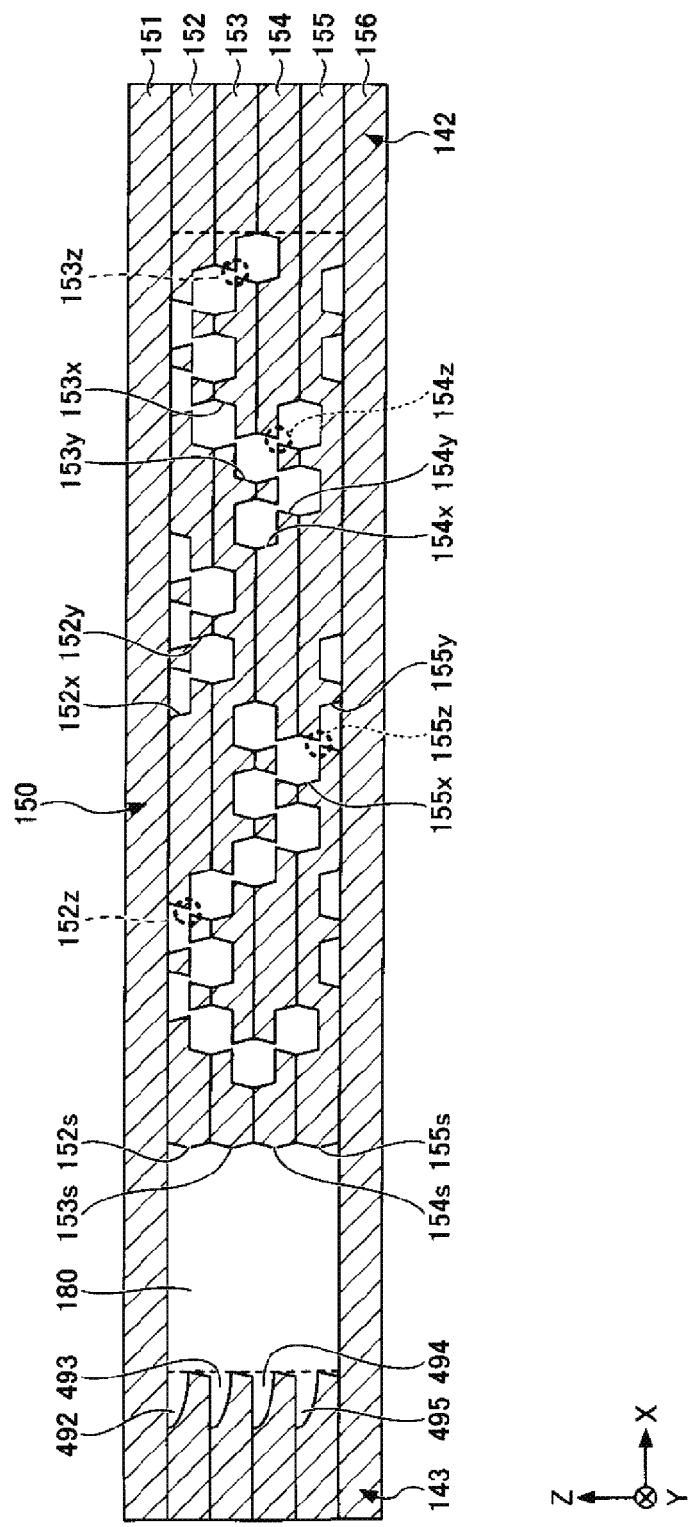
FIG. 13 is a sectional view exemplifying an internal configuration of a loop-type heat pipe in accordance with a second exemplary embodiment (1 thereof).
Figure 14:
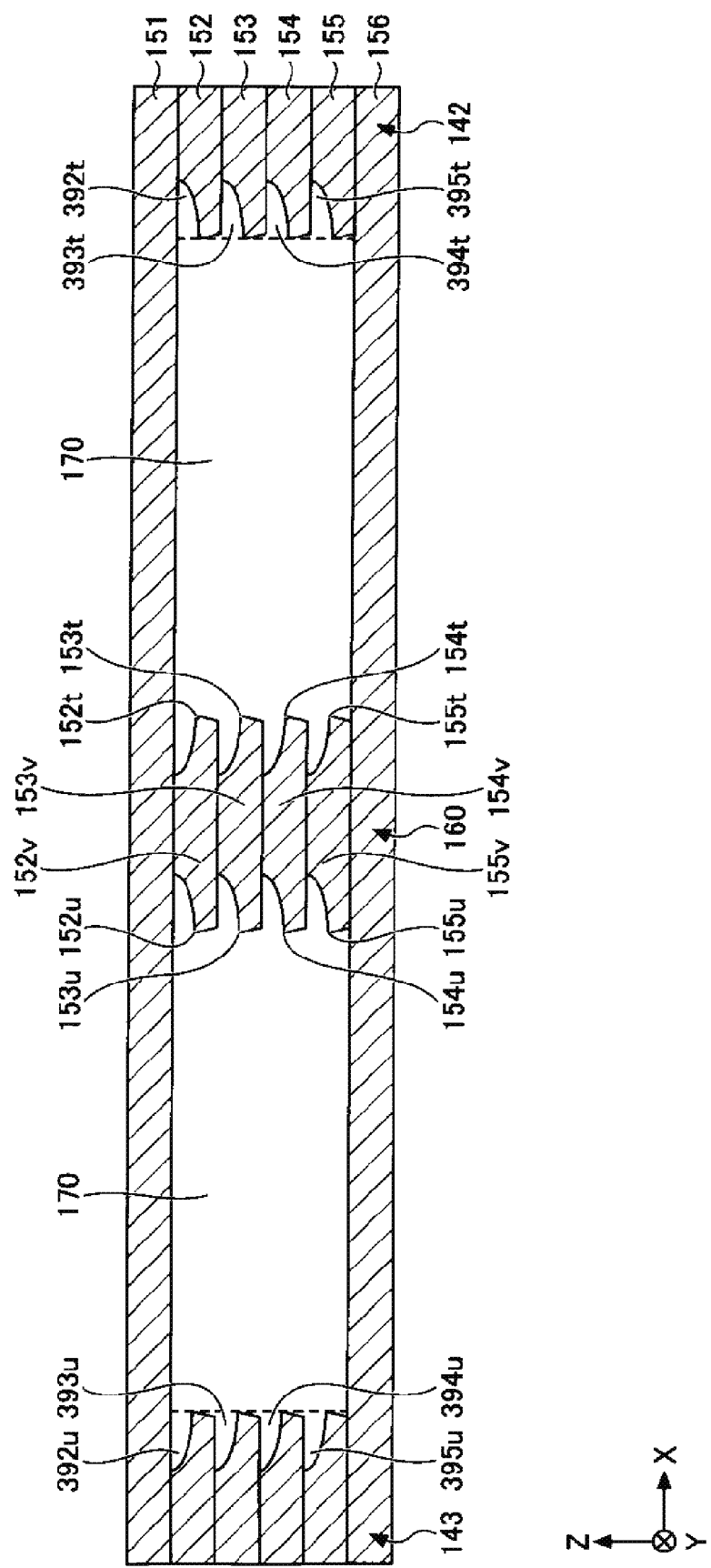
FIG. 14 is a sectional view exemplifying the internal configuration of the loop-type heat pipe in accordance with the second exemplary embodiment (2 thereof).

Subsequently, a second exemplary embodiment is described. The second exemplary embodiment is different from the first exemplary embodiment, in terms of the configurations of the flow channel 170 and the communication flow channel 180. FIGS. 13 and 14 are sectional views exemplifying an internal configuration of a loop-type heat pipe in accordance with the second exemplary embodiment. FIG. 13 is equivalent to a sectional view taken along a line I-I of FIG. 3, and FIG. 14 is equivalent to a sectional view taken along a line II-II of FIG. 3.

The loop-type heat pipe in accordance with the second exemplary embodiment includes the liquid pipe 140, the porous body 150, the columnar support 160, the flow channel 170 and the communication flow channel 180, like the loop-type heat pipe 100 of the first exemplary embodiment.

However, as shown in FIG. 13, at the pipe wall 143-side, a groove 492 hollowed from the upper surface to the substantially central part in the thickness direction is formed at an edge of the opening 152s, like the bottomed hole 152x. That is, the upper surface of the metal layer 152 is formed with the groove 492 to connect to the communication flow channel 180. A depth of the groove 492 may be set to about a half of the thickness of the metal layer 152, for example.

Also, as shown in FIG. 13, at the pipe wall 143-side, a groove 493 hollowed from the upper surface to the substantially central part in the thickness direction is formed at an edge of the opening 153s, like the bottomed hole 153x. That is, the upper surface of the metal layer 153 is formed with the groove 493 to connect to the communication flow channel 180. A depth of the groove 493 may be set to about a half of the thickness of the metal layer 153, for example.

Also, as shown in FIG. 13, at the pipe wall 143-side, a groove 494 hollowed from the upper surface to the substantially central part in the thickness direction is formed at an edge of the opening 154s, like the bottomed hole 154x. That is, the upper surface of the metal layer 154 is formed with the groove 494 to connect to the communication flow channel 180. A depth of the groove 494 may be set to about a half of the thickness of the metal layer 154, for example.

Also, as shown in FIG. 13, at the pipe wall 143-side, a groove 495 hollowed from the upper surface to the substantially central part in the thickness direction is formed at an edge of the opening 155s, like the bottomed hole 155x. That is, the upper surface of the metal layer 155 is formed with the groove 495 to connect to the communication flow channel 180. A depth of the groove 495 may be set to about a half of the thickness of the metal layer 155, for example.

The grooves 492 to 495 have a concave inner wall surface, which is a curved surface, respectively. Also, in FIG. 13, a sectional shape of the bottomed holes included in the porous body 150 is a tapered shape. However, the bottomed holes included in the porous body 150 may also have a concave inner wall surface, which is a curved surface, respectively.

The openings 152s to 155s are formed at overlapping positions, as seen from above. Also, for example, the grooves 492 to 495 are formed to extend along the liquid pipe 140 (to extend in substantially parallel with the communication flow channel 180 in the Y direction).

Also, as shown in FIG. 14, in the second exemplary embodiment, grooves formed in the side surfaces of the columnar support 160 and the wall surfaces of the liquid pipe 140 between the end portion 150B of the porous body 150 and the condenser 120 are different from the first exemplary embodiment.

That is, as shown in FIG. 14, at both sides of the pipe wall 142 and the columnar support 160, grooves 392t hollowed from the upper surface to the substantially central part in the thickness direction are formed at an edge of the opening 152t, like the bottomed hole 152x. Also, at both sides of the pipe wall 143 and the columnar support 160, grooves 392u hollowed from the upper surface to the substantially central part in the thickness direction are formed at an edge of the opening 152u, like the bottomed hole 152x. That is, the upper surface of the metal layer 152 is formed with the grooves 392t, 392u to connect to the flow channel 170. A depth of each of the grooves 392t, 392u may be set to about a half of the thickness of the metal layer 154, for example.

Also, as shown in FIG. 14, at both sides of the pipe wall 142 and the columnar support 160, grooves 393t hollowed from the upper surface to the substantially central part in the thickness direction are formed at an edge of the opening 153t, like the bottomed hole 153x. Also, at both sides of the pipe wall 143 and the columnar support 160, grooves 393u hollowed from the upper surface to the substantially central part in the thickness direction are formed at an edge of the opening 153u, like the bottomed hole 153x. That is, the upper surface of the metal layer 153 is formed with the grooves 393t, 393u to connect to the flow channel 170. A depth of each of the grooves 393t, 393u may be set to about a half of the thickness of the metal layer 153, for example.

Also, as shown in FIG. 14, at both sides of the pipe wall 142 and the columnar support 160, grooves 394t hollowed from the upper surface to the substantially central part in the thickness direction are formed at an edge of the opening 154t, like the bottomed hole 154x. Also, at both sides of the pipe wall 143 and the columnar support 160, grooves 394u hollowed from the upper surface to the substantially central part in the thickness direction are formed at an edge of the opening 154u, like the bottomed hole 154x. That is, the upper surface of the metal layer 154 is formed with the grooves 394t, 394u to connect to the flow channel 170. A depth of each of the grooves 394t, 394u may be set to about a half of the thickness of the metal layer 154, for example.

Also, as shown in FIG. 14, at both sides of the pipe wall 142 and the columnar support 160, grooves 395t hollowed from the upper surface to the substantially central part in the thickness direction are formed at an edge of the opening 155t, like the bottomed hole 154x. Also, at both sides of the pipe wall 143 and the columnar support 160, grooves 394u hollowed from the upper surface to the substantially central part in the thickness direction are formed at an edge of the opening 155u, like the bottomed hole 155x. That is, the upper surface of the metal layer 155 is formed with the grooves 395t, 395u to connect to the flow channel 170. A depth of each of the grooves 395t, 395u may be set to about a half of the thickness of the metal layer 155, for example.

The grooves 392t to 395t, 392u to 395u have a concave inner wall surface, which is a curved surface, respectively. However, the present disclosure is not limited thereto. For example, the grooves may have a tapered shape, respectively, like the sectional shape of the bottomed holes included in the porous body 150.

The openings 152t to 155t are formed at overlapping positions, as seen from above, and the openings 152u to 155u are formed at overlapping positions, as seen from above. Also, for example, the grooves 392t to 395t, 392u to 395u are formed to extend along the liquid pipe 140 (to extend in substantially parallel with the flow channel 170 in the Y direction).

The other configurations are the same as the first exemplary embodiment.

Even with the second exemplary embodiment, it is possible to accomplish the same effects as the first exemplary embodiment. Also, since the grooves 392t to 395t, 392u to 395u are formed in the wall surfaces of the flow channel 170 and the side surfaces of the columnar support 160, the flowing of the liquid operating fluid C is promoted by the grooves 392t to 395t, 392u to 395u. Therefore, since the number of the grooves is larger than the first exemplary embodiment, it is possible to further improve the heat transport performance.

Also, since the grooves 492 to 495 are formed in the wall surface of the communication flow channel 180, the flowing of the liquid operating fluid C is promoted by the grooves 492 to 495. Since the number of the grooves is larger than the first reference example of the first exemplary embodiment, it is possible to more rapidly guide the operating fluid C injected from the inlet 141 to the flow channel 170.

For example, the grooves 392t, 392u, 492 can be concurrently formed with the bottomed holes 152x. That is, the planar shapes of the opening 310z (refer to FIG. 10B) and the opening 310y (refer to FIG. 8B) to be formed in the resist layers 310 formed on the metal sheet 152b are made to conform to the shapes of the grooves 392t, 392u, 492. Then, the metal sheet 152b is half etched. In this way, the grooves 392t, 392u, 492 can be concurrently formed with the bottomed holes 152x. Like the grooves 392t, 392u, 492, the grooves 393t to 395t, 393u to 395u, 493 to 495 can be concurrently formed with the bottomed holes 153x to 155x.

In the meantime, like the first exemplary embodiment, the wall surface of the communication flow channel 180 may not be formed with the grooves 492 to 495. Also, like the modified embodiment of the first exemplary embodiment, the wall surface of the communication flow channel 180 may be formed with the grooves 293, 295, instead of the grooves 492 to 495.

Third Exemplary Embodiment

Figure 15:
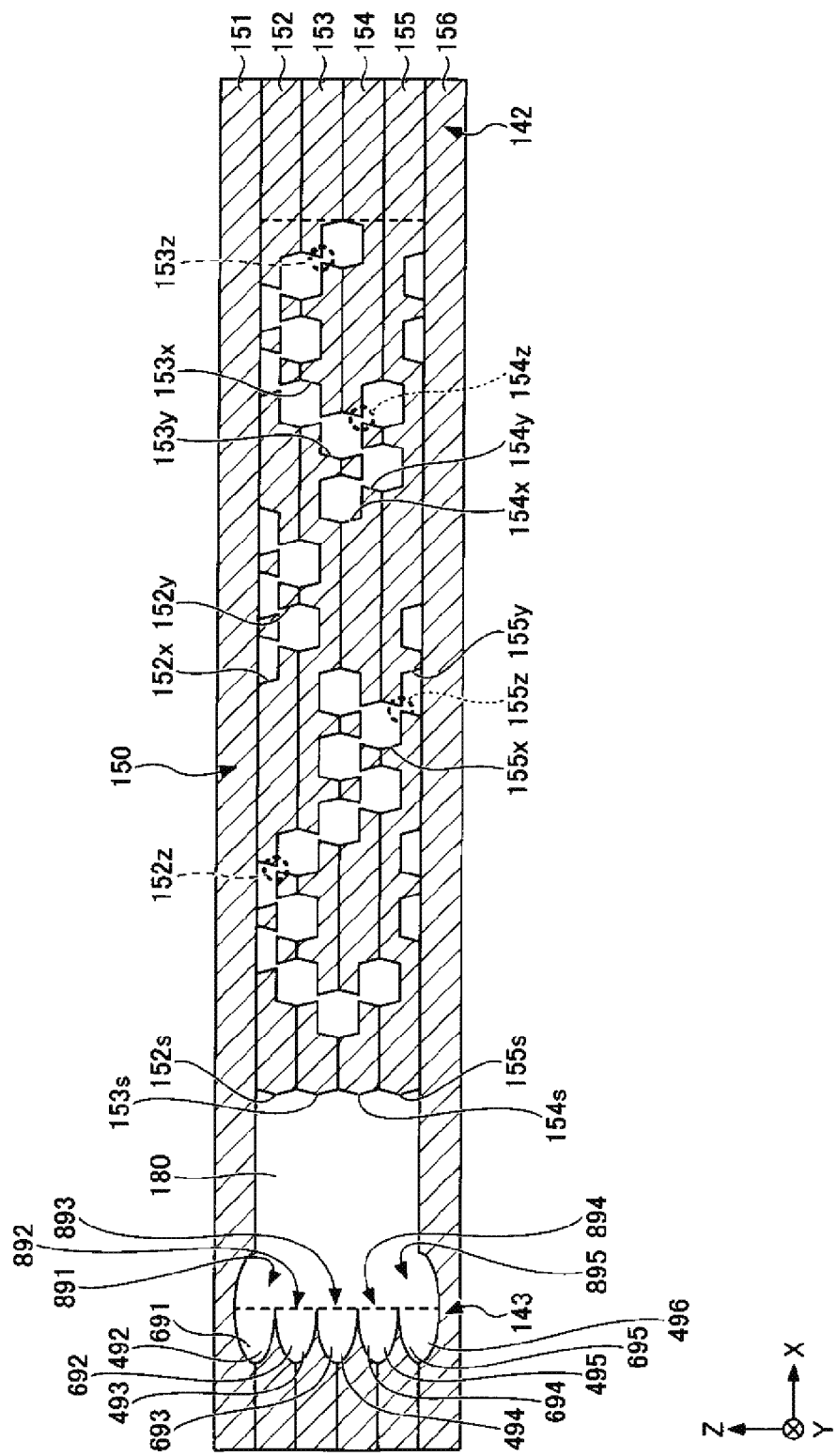
FIG. 15 is a sectional view exemplifying an internal configuration of a loop-type heat pipe in accordance with a third exemplary embodiment (1 thereof).
Figure 16:
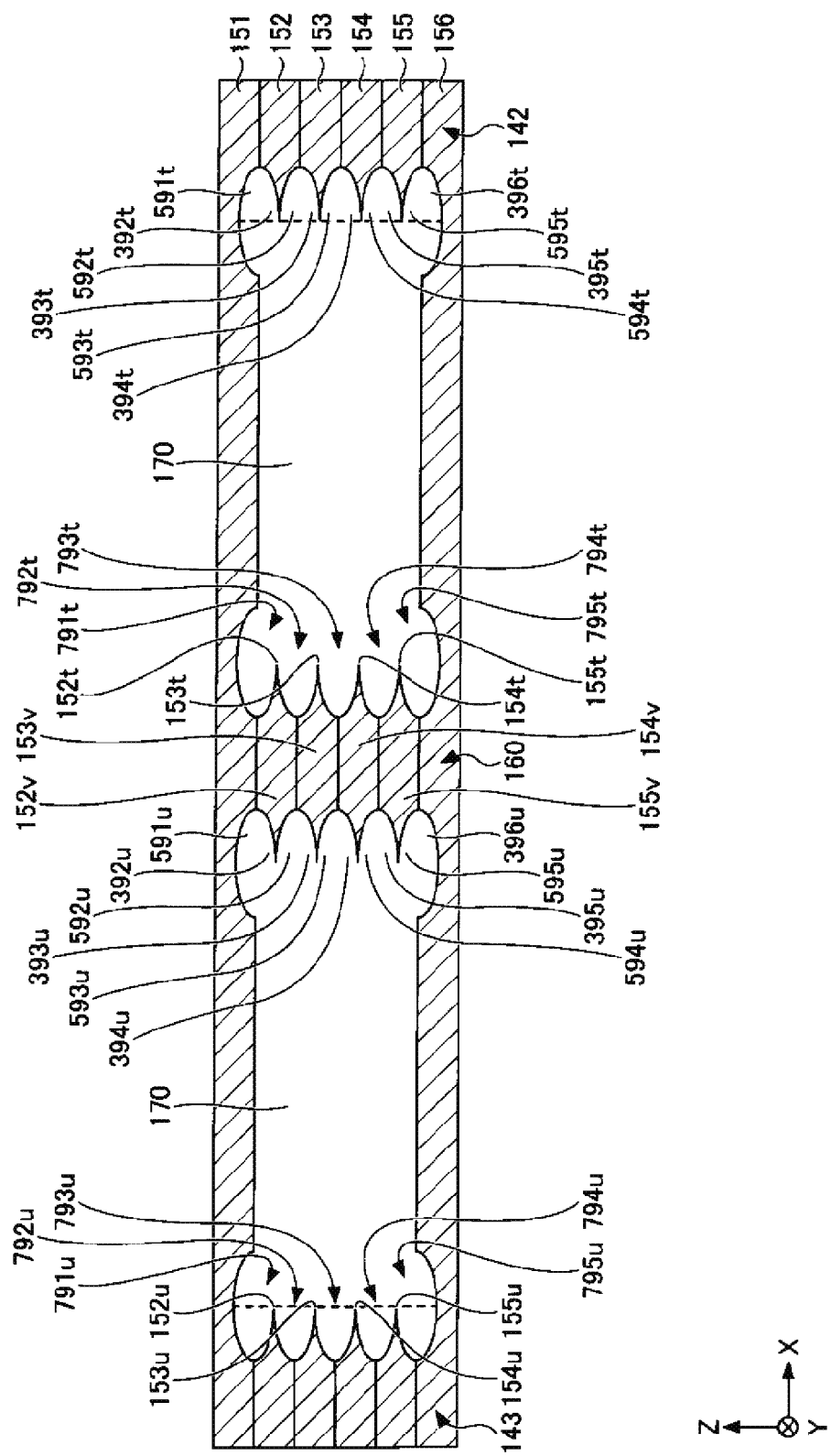
FIG. 16 is a sectional view exemplifying the internal configuration of the loop-type heat pipe in accordance with the third exemplary embodiment (2 thereof).

Subsequently, a third exemplary embodiment is described. The third exemplary embodiment is different from the first exemplary embodiment, in terms of the configurations of the flow channel 170 and the communication flow channel 180. FIGS. 15 and 16 are sectional views exemplifying an internal configuration of a loop-type heat pipe in accordance with the third exemplary embodiment. FIG. 15 is equivalent to a sectional view taken along a line I-I of FIG. 3, and FIG. 16 is equivalent to a sectional view taken along a line II-II of FIG. 3.

The loop-type heat pipe in accordance with the third exemplary embodiment includes the liquid pipe 140, the porous body 150, the columnar support 160, the flow channel 170 and the communication flow channel 180, like the loop-type heat pipe 100 of the first exemplary embodiment.

However, as shown in FIG. 15, at the pipe wall 143-side, a groove 692 hollowed from the lower surface to the substantially central part in the thickness direction as well as the groove 492 is formed at the edge of the opening 152s, like the bottomed hole 152y. That is, the lower surface of the metal layer 152 is formed with the groove 692 to connect to the communication flow channel 180. A depth of the groove 692 may be set to about a half of the thickness of the metal layer 152, for example.

Also, as shown in FIG. 15, at the pipe wall 143-side, a groove 693 hollowed from the lower surface to the substantially central part in the thickness direction as well as the groove 493 is formed at the edge of the opening 153s, like the bottomed hole 153y. That is, the lower surface of the metal layer 153 is formed with the groove 693 to connect to the communication flow channel 180. A depth of the groove 693 may be set to about a half of the thickness of the metal layer 153, for example.

Also, as shown in FIG. 15, at the pipe wall 143-side, a groove 694 hollowed from the lower surface to the substantially central part in the thickness direction as well as the groove 494 is formed at the edge of the opening 154s, like the bottomed hole 154y. That is, the lower surface of the metal layer 154 is formed with the groove 694 to connect to the communication flow channel 180. A depth of the groove 694 may be set to about a half of the thickness of the metal layer 154, for example.

Also, as shown in FIG. 15, at the pipe wall 143-side, a groove 695 hollowed from the lower surface to the substantially central part in the thickness direction as well as the groove 495 is formed at the edge of the opening 155s, like the bottomed hole 155y. That is, the lower surface of the metal layer 155 is formed with the groove 695 to connect to the communication flow channel 180. A depth of the groove 695 may be set to about a half of the thickness of the metal layer 155, for example.

The groove 692 and the groove 493 are connected to form a groove 892, the groove 693 and the groove 494 are connected to form a groove 893, and the groove 694 and the groove 495 are connected to form a groove 894.

Also, as shown in FIG. 15, at the pipe wall 143-side, a groove 691 hollowed from the lower surface to the substantially central part in the thickness direction is formed in the metal layer 151 so as to connect to the groove 492. That is, the lower surface of the metal layer 151 is formed with the groove 691 to connect to the communication flow channel 180. A depth of the groove 691 may be set to about a half of the thickness of the metal layer 151, for example. The groove 691 and the groove 492 are connected to form a groove 891.

Also, as shown in FIG. 15, at the pipe wall 143-side, a groove 496 hollowed from the upper surface to the substantially central part in the thickness direction is formed in the metal layer 156 so as to connect to the groove 695. That is, the upper surface of the metal layer 156 is formed with the groove 496 to connect to the communication flow channel 180. A depth of the groove 496 may be set to about a half of the thickness of the metal layer 156, for example. The groove 695 and the groove 496 are connected to form a groove 895.

The grooves 691 to 695, 496 have a concave inner wall surface, which is a curved surface, respectively. Also, in FIG. 15, a sectional shape of the bottomed holes included in the porous body 150 is a tapered shape. However, the bottomed holes included in the porous body 150 may also have a concave inner wall surface, which is a curved surface, respectively.

Like the second exemplary embodiment, the openings 152s to 155s are formed at overlapping positions, as seen from above. Also, for example, the grooves 891 to 895 are formed to extend along the liquid pipe 140 (to extend in substantially parallel with the communication flow channel 180 in the Y direction).

Also, in the third exemplary embodiment, as shown in FIG. 16, the grooves formed in the side surfaces of the columnar support 160 and the wall surfaces of the liquid pipe 140 between the end portion 150B of the porous body 150 and the condenser 120 are different from the second exemplary embodiment.

That is, as shown in FIG. 16, at both sides of the pipe wall 142 and the columnar support 160, grooves 592t hollowed from the lower surface to the substantially central part in the thickness direction as well as the groove 392t are formed at the edge of the opening 152t, like the bottomed hole 152y. Also, at both sides of the pipe wall 143 and the columnar support 160, grooves 592u hollowed from the lower surface to the substantially central part in the thickness direction as well as the groove 392u are formed at the edge of the opening 152u, like the bottomed hole 152y. That is, the lower surface of the metal layer 152 is formed with the grooves 592t, 592u to connect to the flow channel 170. A depth of each of the grooves 592t, 592u may be set to about a half of the thickness of the metal layer 152, for example.

Also, as shown in FIG. 16, at both sides of the pipe wall 142 and the columnar support 160, grooves 593t hollowed from the lower surface to the substantially central part in the thickness direction as well as the groove 393t are formed at the edge of the opening 153t, like the bottomed hole 153y. Also, at both sides of the pipe wall 143 and the columnar support 160, grooves 593u hollowed from the lower surface to the substantially central part in the thickness direction as well as the groove 393u are formed at the edge of the opening 153u, like the bottomed hole 153y. That is, the lower surface of the metal layer 153 is formed with the grooves 593t, 593u to connect to the flow channel 170. A depth of each of the grooves 593t, 593u may be set to about a half of the thickness of the metal layer 153, for example.

Also, as shown in FIG. 16, at both sides of the pipe wall 142 and the columnar support 160, grooves 594t hollowed from the lower surface to the substantially central part in the thickness direction as well as the groove 394t are formed at the edge of the opening 154t, like the bottomed hole 154y. Also, at both sides of the pipe wall 143 and the columnar support 160, grooves 594u hollowed from the lower surface to the substantially central part in the thickness direction as well as the groove 394u are formed at the edge of the opening 154u, like the bottomed hole 154y. That is, the lower surface of the metal layer 154 is formed with the grooves 594t, 594u to connect to the flow channel 170. A depth of each of the grooves 594t, 594u may be set to about a half of the thickness of the metal layer 154, for example.

Also, as shown in FIG. 16, at both sides of the pipe wall 142 and the columnar support 160, grooves 595t hollowed from the lower surface to the substantially central part in the thickness direction as well as the groove 395t are formed at the edge of the opening 155t, like the bottomed hole 155y. Also, at both sides of the pipe wall 143 and the columnar support 160, grooves 595u hollowed from the lower surface to the substantially central part in the thickness direction as well as the groove 395u are formed at the edge of the opening 155u, like the bottomed hole 155y. That is, the lower surface of the metal layer 155 is formed with the grooves 595t, 595u to connect to the flow channel 170. A depth of each of the grooves 595t, 595u may be set to about a half of the thickness of the metal layer 155, for example.

The groove 592t and the groove 393t are connected to form a groove 792t, the groove 593t and the groove 394t are connected to form a groove 793t, and the groove 594t and the groove 395t are connected to form a groove 794t. Also, the groove 592u and the groove 393u are connected to form a groove 792u, the groove 593u and the groove 394u are connected to form a groove 793u, and the groove 594u and the groove 395u are connected to form a groove 794u.

Also, as shown in FIG. 16, at both sides of the pipe wall 142 and the columnar support 160, grooves 591t hollowed from the lower surface to the substantially central part in the thickness direction are formed in the metal layer 151 so as to connect to the grooves 392t. Also, at both sides of the pipe wall 143 and the columnar support 160, grooves 591u hollowed from the lower surface to the substantially central part in the thickness direction are formed in the metal layer 151 so as to connect to the grooves 392u. That is, the lower surface of the metal layer 151 is formed with the grooves 591t, 591u to connect to the flow channel 170. A depth of each of the grooves 591t, 591u may be set to about a half of the thickness of the metal layer 151, for example. The groove 591t and the groove 392t are connected to form a groove 791t, and the groove 591u and the groove 392u are connected to form a groove 791u.

Also, as shown in FIG. 16, at both sides of the pipe wall 142 and the columnar support 160, grooves 396t hollowed from the upper surface to the substantially central part in the thickness direction are formed in the metal layer 156 so as to connect to the groove 595t. Also, at both sides of the pipe wall 142 and the columnar support 160, grooves 396u hollowed from the upper surface to the substantially central part in the thickness direction are formed in the metal layer 156 so as to connect to the grooves 595u. That is, the upper surface of the metal layer 156 is formed with the grooves 396t, 396u to connect to the flow channel 170. A depth of each of the grooves 396t, 396u may be set to about a half of the thickness of the metal layer 156, for example. The groove 595u and the groove 396u are connected to form a groove 795t, and the groove 595u and the groove 396u are connected to form a groove 795u.

The grooves 591t to 595t, 591u to 595u, 396t, 396u have a concave inner wall surface, which is a curved surface, respectively. Also, the present disclosure is not limited thereto. For example, the grooves may have a tapered shape, like the sectional shape of the bottomed holes included in the porous body 150 of FIG. 15.

Like the second exemplary embodiment, the openings 152t to 155t are formed at overlapping positions, as seen from above. Also, for example, the grooves 791t to 795t, 791u to 795u are formed to extend along the liquid pipe 140 (to extend in substantially parallel with the flow channel 170 in the Y direction).

The other configurations are the same as the second exemplary embodiment.

Even with the third exemplary embodiment, it is possible to accomplish the same effects as the second exemplary embodiment. Also, since the grooves 791t to 795t, 791u to 795u are formed in the wall surface of the flow channel 170 and the side surfaces of the columnar support 160, the flowing of the liquid operating fluid C is promoted by the grooves 791t to 795t, 791u to 795u. Therefore, since the number of the grooves is larger than the second exemplary embodiment, it is possible to further improve the heat transport performance.

Also, since the grooves 891 to 895 are formed in the wall surface of the communication flow channel 180, the flowing of the liquid operating fluid C is promoted by the grooves 891 to 895. Since the number of the grooves is larger than the second exemplary embodiment, it is possible to more rapidly guide the operating fluid C injected from the inlet 141 to the flow channel 170.

For example, the grooves 592t, 592u, 692 can be concurrently formed with the bottomed holes 152y, as follows. That is, the planar shapes of the opening 320z (refer to FIG. 10B) and the opening 320y (refer to FIG. 8B) to be formed in the resist layers 320 formed on the metal sheet 152b are made to conform to the shapes of the grooves 592t, 592u, 692. Then, the metal sheet 152b is half etched. In this way, the grooves 592t, 592u, 692 can be concurrently formed with the bottomed holes 152y. Like the grooves 592t, 592u, 692, the grooves 593t to 595t, 593u to 595u, 693 to 695 can be concurrently formed with the bottomed holes 153y to 155y.

Also, the grooves 591t, 591u, 691, 396t, 396u, 496 of the metal layers 151, 156 can be formed by half etching the resist layers having openings in regions in which the grooves 591t, 591u, 691, 396t, 396u, 496 of the metal layers 151, 156 are to be formed.

In the meantime, like the first exemplary embodiment, the wall surface of the communication flow channel 180 may not be formed with the grooves 492 to 495. Also, like the modified embodiment of the first exemplary embodiment, the wall surface of the communication flow channel 180 may be formed with the grooves 293, 295, instead of the grooves 492 to 495.

Fourth Exemplary Embodiment

Figure 17:
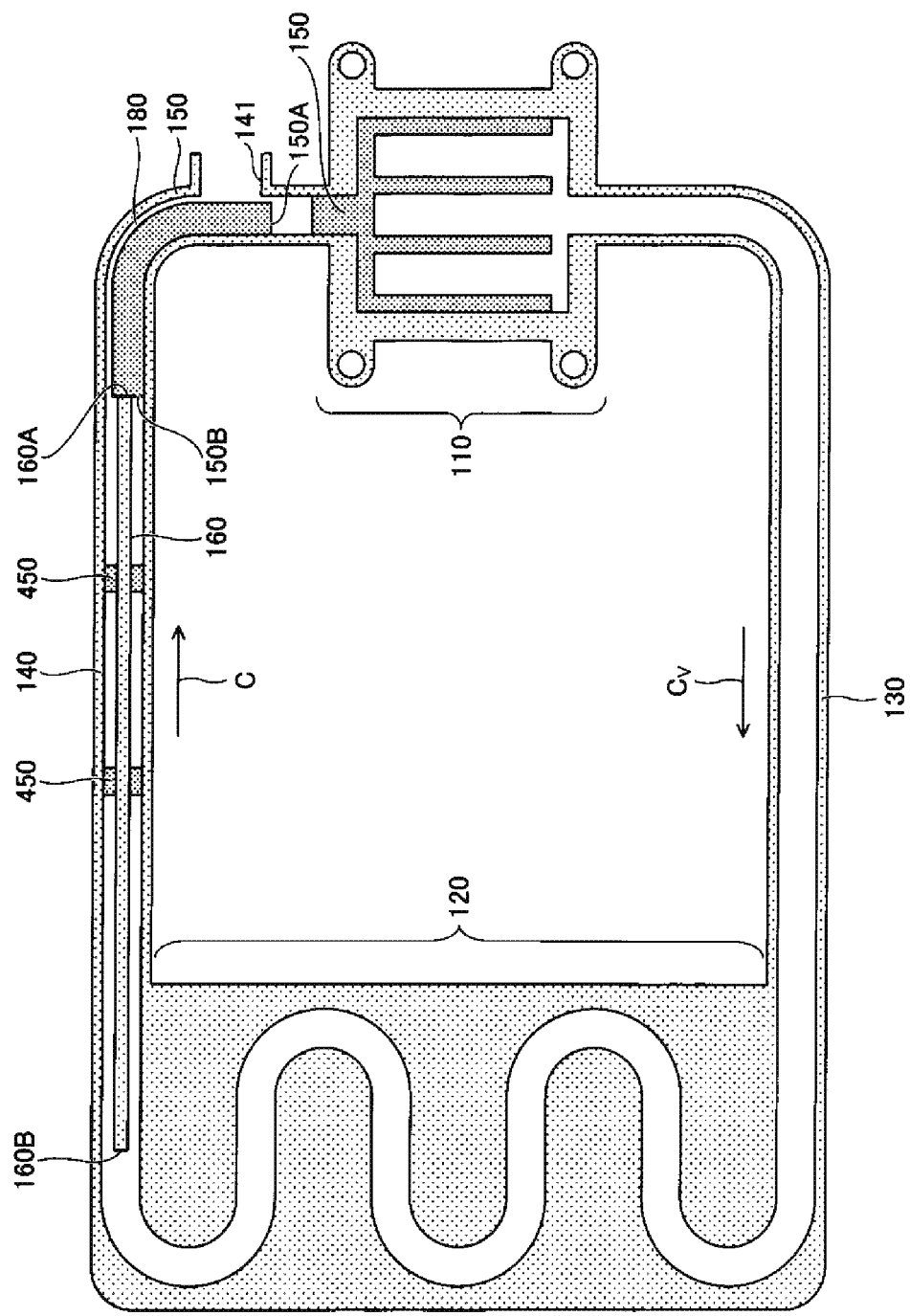
FIG. 17 is a schematic plan view exemplifying an internal configuration of a loop-type heat pipe in accordance with a fourth exemplary embodiment.

Subsequently, a fourth exemplary embodiment is described. The fourth exemplary embodiment is different from the first exemplary embodiment, in terms of the configuration of the flow channel 170. FIG. 17 is a schematic plan view exemplifying an internal configuration of a loop-type heat pipe in accordance with the fourth exemplary embodiment. In FIG. 17, the metal layer (the metal layer 151 shown in FIGS. 4 to 6), which is one outermost layer, is not shown, like FIG. 3.

The loop-type heat pipe of the fourth exemplary embodiment includes two shield bodies 450 between an end portion 160A and an end portion 160B in the liquid pipe 140. The shield body 450 has bottomed holes and fine pores formed in the metal layers 152 to 155, like the porous body 150, for example. The shield bodies 450 are provided between the pipe wall 142 and the columnar support 160 and between the pipe wall 143 and the columnar support 160, and fill the inside of the liquid pipe 140 at parts between the end portion 160A and the end portion 160B.

In the fourth exemplary embodiment, the shield bodies 450 absorb and retain the operating fluid C, which cannot be completely absorbed by the porous body 150, and blocks the liquid operating fluid C from flowing from the porous body 150 toward the condenser 120 in the liquid pipe 140. Therefore, it is possible to further suppress the dry-out. Also, the shield bodies 450 contribute to improvement on the mechanical strength in the thickness direction (Z direction).

The shield bodies 450 can be concurrently formed with the porous body 150. In the first exemplary embodiment, since the solid parts 152V to 155V included in the metal layers 152 to 155 are simply connected to the other parts of the metal layers 152 to 155 at the part corresponding to the end portion 160A, the solid parts 152V to 155V may be deformed. In contrast, in the fourth exemplary embodiment, since the parts becoming the shield bodies 450 interconnect the parts becoming the pipe walls 142, 143 and the solid parts 152V to 155V, the shape stability of the solid parts 152V to 155V is improved.

Meanwhile, in the fourth exemplary embodiment, the two shield bodies 450 are provided in the liquid pipe 140. However, the number of the shield bodies is not particularly limited, and may be one or three or more. Also, the positions of the shield bodies 450 in the liquid pipe 140 are not particularly limited.

Fifth Exemplary Embodiment

Figure 18:
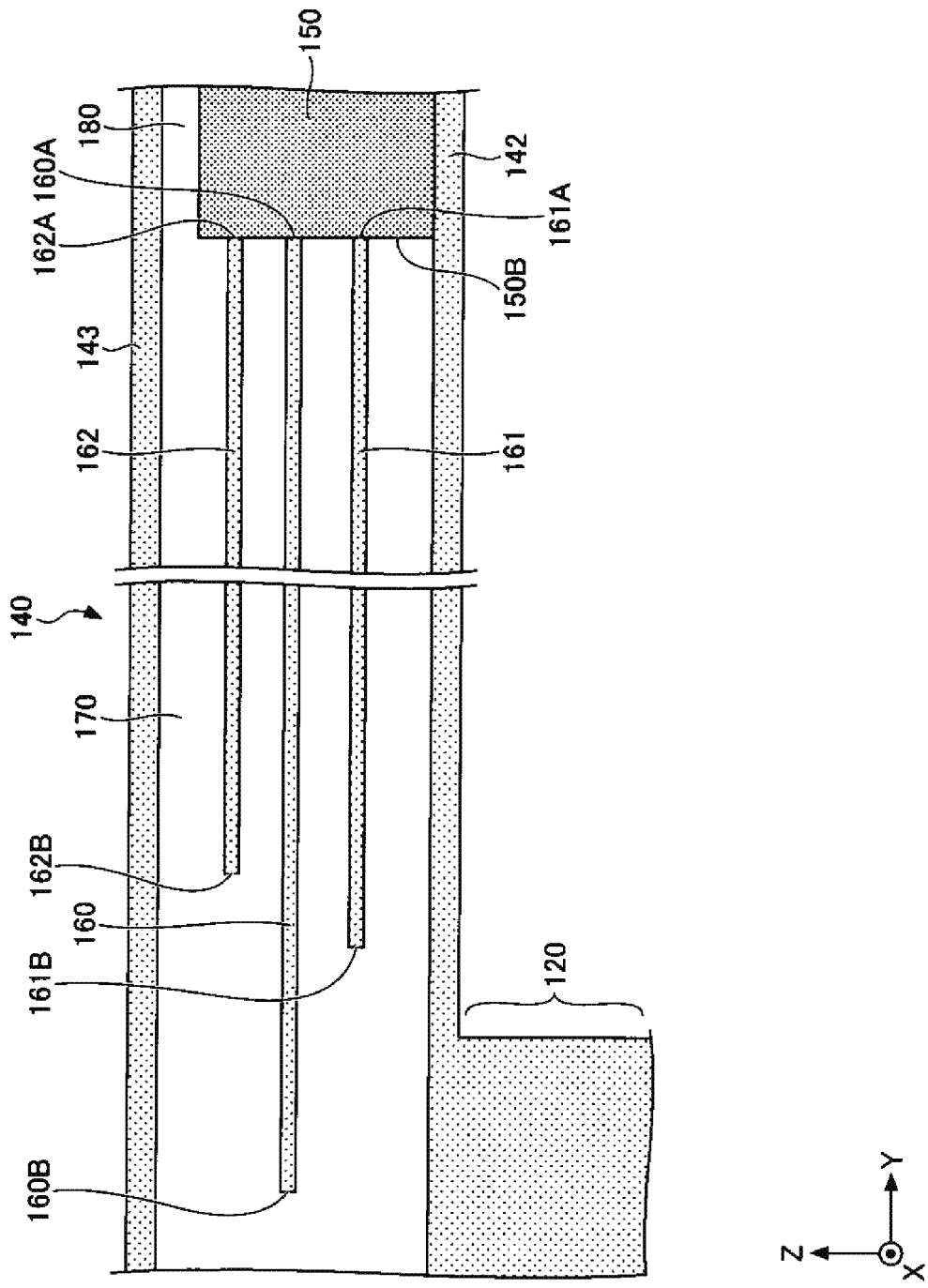
FIG. 18 is a schematic plan view exemplifying an internal configuration of a loop-type heat pipe in accordance with a fifth exemplary embodiment.

Subsequently, a fifth exemplary embodiment is described. The fifth exemplary embodiment is different from the first exemplary embodiment, in terms of the configuration of the flow channel 170. FIG. 18 is a schematic plan view exemplifying an internal configuration of a loop-type heat pipe in accordance with the fifth exemplary embodiment. In FIG. 18, the metal layer (the metal layer 151 shown in FIGS. 4 to 6), which is one outermost layer, is not shown, like FIG. 3. Also, in FIG. 18, the part of the liquid pipe 140 is enlarged.

In the loop-type heat pipe of the fifth exemplary embodiment, in addition to the columnar support 160, solid columnar supports 161, 162 extending along the liquid pipe 140 are provided in the flow channel 170. The columnar supports 161, 162 may have a structure where the metal layers 151 to 156 are stacked, for example, respectively. The columnar supports 161, 162 are in contact with the metal layer 151, which is one outermost layer of the liquid pipe 140, and the metal layer 156, which is the other outermost layer, like the columnar support 160. The columnar support 161 is provided at a side of the columnar support 160 facing toward the pipe wall 142, and the columnar support 162 is provided at a side of the columnar support 160 facing toward the pipe wall 143. One end portion 161A of the columnar support 161 is connected to the end portion 150B of the porous body 150, and the other end portion 161B is located closer to the porous body 150 than the end portion 160B of the columnar support 160. One end portion 162A of the columnar support 162 is connected to the end portion 150B of the porous body 150, and the other end portion 162B is located closer to the porous body 150 than the end portion 161B of the columnar support 161. That is, the columnar support 161 is shorter than the columnar support 160 and the columnar support 162 is shorter than the columnar support 161 in the Y direction. Like this, in the fifth exemplary embodiment, the three columnar supports 160 to 162 are aligned side by side in the X direction.

Each side surface of the columnar supports 161, 162 is formed with grooves extending along the liquid pipe 140 (extending in substantially parallel with the flow channel 170 in the Y direction), like the grooves 193t, 195t, 193u, 195u formed in the side surfaces of the columnar support 160.

The other configurations are the same as the first exemplary embodiment.

According to the fifth exemplary embodiment, it is possible to accomplish the same effects as the first exemplary embodiment. Also, since the columnar supports 161, 162 are provided, it is possible to further promote the flowing of the liquid operating fluid C. Also, considering the phase of the operating fluid C, the pressure loss is likely to increase in a region, which is closer to the condenser 120, in the liquid pipe 140. In the fifth exemplary embodiment, in the region closer to the condenser 120, the number of the columnar supports is smaller, and the sectional area perpendicular to the flowing direction of the operating fluid C is greater. Therefore, it is possible to suppress the increase in pressure loss due to the columnar supports.

In the meantime, the side surfaces of the columnar supports 161, 162 may be formed with the grooves formed in the side surfaces of the columnar support 160 of the second or third exemplary embodiment. Also, like the fourth exemplary embodiment, the shield body 450 may be provided in the liquid pipe 140.

In any exemplary embodiment, the porous body 150 in the liquid pipe 140 is not required to be in contact with the inner pipe wall 142 and may be spaced from the pipe wall 142. Also, the porous body 150 may fill the inside of the liquid pipe 140 at a part between the inlet 141 and the evaporator 110. For example, the porous body 150 may be in contact with the outer pipe wall 143.

Also, a porous body configured to guide the operating fluid C liquefied by the condenser 120 toward the evaporator 110 may be provided with being spaced from the porous body 150 at a part, which is located closer to the condenser 120 than the end portion 150B, of the liquid pipe 140. This porous body may be provided in the vicinity of the pipe walls 142, 143, for example.

Also, in the region of the porous body 150, the bottomed holes may be formed in the metal layer 151 or the metal layer 156. Also, in the region of the flow channel 170, the bottomed holes may be formed in the metal layer 151 or the metal layer 156 exposed to the flow channel 170, within a range in which the operating fluid C retained in the porous body 150 is not to be exuded toward the flow channel 170. The bottomed holes are formed in the metal layer 151 or the metal layer 156, so that it is possible to further improve the heat transport performance.

Also, a solid columnar support may be provided between the porous body 150 and the communication flow channel 180.

Also, it is not necessary that the holes configuring the porous body 150 are the bottomed holes, and the through-holes may be included in the porous body 150.

Also, the position of the inlet 141 is not particularly limited. For example, in the liquid pipe 140 of which the planar shape shown in FIG. 3 is an L-shape, the inlet 141 may be provided at a part closer to the condenser 120 than a bent part of the liquid pipe.

The foregoing description of the exemplary embodiments of the present disclosure has been provided for the purposes of illustration and description. It is not intended to be exhaustive or to limit the present disclosure to the precise forms disclosed. Obviously, many modifications and variations will be apparent to practitioners skilled in the art. The embodiments were chosen and described in order to best explain the principles of the present disclosure and its practical applications, thereby enabling others skilled in the art to understand the present disclosure for various embodiments and with the various modifications as are suited to the particular use contemplated. It is intended that the scope of the present disclosure be defined by the following claims and their equivalents.

This disclosure further encompasses various exemplary embodiments, for example, described below.

1. A method of manufacturing a loop-type heat pipe comprising an evaporator configured to vaporize an operating fluid, a condenser configured to liquefy the operating fluid, a liquid pipe configured to interconnect the evaporator and the condenser; and a steam pipe configured to interconnect the evaporator and the condenser and to form a loop together with the liquid pipe, the method comprising:

etching at least one metal layer to form a plurality of bottomed holes configuring a porous body configured to retain therein the liquid operating fluid and to form a solid part configuring a solid columnar support configured to guide the operating fluid liquefied by the condenser to the porous body; and stacking a plurality of metal layers including the etched metal layer to form the evaporator, the condenser, the liquid pipe and the steam pipe and to form the solid columnar support and the porous body in the liquid pipe, wherein in the etching of the metal layer, the solid part is formed so as to form at least one groove at a side surface of the columnar support.

What is claimed is:

1. A loop-type heat pipe comprising:
   an evaporator configured to vaporize an operating fluid;
   a condenser configured to liquefy the operating fluid;
   a liquid pipe configured to interconnect the evaporator and the condenser;
   a steam pipe configured to interconnect the evaporator and the condenser and to form a loop together with the liquid pipe; and
   a porous body provided in the liquid pipe and configured to retain therein the liquid operating fluid,
   wherein
   the liquid pipe is formed of a plurality of stacked metal layers comprising a pair of outermost metal layers and a plurality of inner metal layers stacked between the pair of outermost metal layers,
   the plurality of inner metal layers each having a solid part and an opening,
   the solid parts are stacked on each other so as to form a solid columnar support in the liquid pipe, the solid columnar support having a first end in contact with one of the pair of outermost metal layers and a second end in contact with an other of the pair of outermost metal layers, the solid columnar support being configured to guide the operating fluid liquefied by the condenser to the porous body,
   the openings are overlay one another so as to define a flow channel in the liquid pipe, and
   at least one first groove is defined in a side surface of the columnar support.

2. The loop-type heat pipe according to claim 1, wherein the first groove extends along the liquid pipe.

3. The loop-type heat pipe according to claim 1, wherein each of the plurality of inner metal layers has a second solid part, the second solid parts are stacked on each other so as to form a second solid columnar support in the liquid pip, the second solid columnar support having a first end in contact with one of the pair of outermost metal layers and a second end in contact with an other of the pair of outermost metal layers, the second solid columnar support being configured to guide the operating fluid liquefied by the condenser to the porous body, and at least one first groove is defined in a side surface of the second columnar support, and the second columnar supports is arranged side by side with the columnar support in a direction perpendicular to a direction along the liquid pipe.

4. The loop-type heat pipe according to claim 1, further comprising:

a shield body provided between a pipe wall of the liquid pipe and the columnar support in a region between the porous body and the condenser, and configured to block the operating fluid from flowing from the porous body toward the condenser in the liquid pipe.

5. The loop-type heat pipe according to claim 1, wherein at least one second groove is defined in a wall surface of the liquid pipe.

6. The loop-type heat pipe according to claim 5, wherein the second groove extends along the liquid pipe.

7. The loop-type heat pipe according to claim 1, wherein the porous body has a plurality of bottomed holes, and an inner wall of each of the bottomed holes is formed to have a curved semicircular shape.

8. The loop-type heat pipe according to claim 1, wherein the columnar support extends along the liquid pipe from the porous body to the condenser.

9. The loop-type heat pipe according to claim 1, wherein the columnar support is provided in the liquid pipe at a position between the porous body and the condenser along an axial direction of the liquid pipe.

10. The loop-type heat pipe according to claim 1, wherein the solid parts of the plurality of inner metal layers are alternately formed to have a first width and a second width greater than the first width, so that adjacent solid parts of the plurality of inner metal layers stacked on each other have different widths, and the groove is defined in the columnar support by a pair of the inner metal layers having the second width with one of the inner metal layers having the first width stacked between the pair of the inner metal layers having the second width.

* * * * *